US012765020B2

(12) United States Patent
Ohse

(10) Patent No.: US 12,765,020 B2
(45) Date of Patent: Oct. 13, 2026

(54) SILICON CARBIDE SEMICONDUCTOR DEVICE

(71) Applicant: FUJI ELECTRIC CO., LTD., Kawasaki (JP)

(72) Inventor: Naoyuki Ohse, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 433 days.

(21) Appl. No.: 18/422,926

(22) Filed: Jan. 25, 2024

(65) Prior Publication Data

US 2024/0321947 A1 Sep. 26, 2024

(30) Foreign Application Priority Data

Mar. 20, 2023 (JP) ................................. 2023-044020

(51) Int. Cl.

| | |
|---|---|
| ***H10D 12/00*** | (2025.01) |
| ***H10D 12/01*** | (2025.01) |
| ***H10D 30/66*** | (2025.01) |
| ***H10D 62/13*** | (2025.01) |
| ***H10D 62/40*** | (2025.01) |
| ***H10D 62/832*** | (2025.01) |
| *H10D 62/834* | (2025.01) |

(52) U.S. Cl.

CPC ........... *H10D 62/40* (2025.01); *H10D 12/031* (2025.01); *H10D 30/668* (2025.01); *H10D 62/153* (2025.01); *H10D 62/154* (2025.01); *H10D 62/8325* (2025.01); *H10D 62/834* (2025.01)

(58) Field of Classification Search

CPC .... H10D 62/40; H10D 12/031; H10D 30/668; H10D 62/153; H10D 62/154; H10D 62/8325; H10D 62/834; H10D 12/038; H10D 30/0297; H10D 62/393; H10D 64/62

See application file for complete search history.

(56) References Cited

U.S. PATENT DOCUMENTS

| | | | | |
|---|---|---|---|---|
| 2019/0140093 A1* | 5/2019 | Okumura | ............. | H10D 30/668 |
| 2019/0229191 A1* | 7/2019 | Noguchi | ............ | H10D 30/6706 |
| 2019/0288104 A1* | 9/2019 | Kinoshita | ............ | H10D 30/668 |
| 2020/0312966 A1* | 10/2020 | Tawara | ..................... | H10D 8/00 |
| 2024/0266400 A1* | 8/2024 | Nishio | ................... | H10D 30/66 |

FOREIGN PATENT DOCUMENTS

| | | |
|---|---|---|
| JP | 2009-049198 A | 3/2009 |
| WO | 2017/042963 A1 | 3/2017 |

* cited by examiner

*Primary Examiner* — Samuel Park

(57) ABSTRACT

A silicon carbide semiconductor device includes: a drift layer of a first conductivity-type; a base region of a second conductivity-type provided on a top surface side of the drift layer; a source contact region of the first conductivity-type including silicon carbide having a 3C-structure provided on a top surface side of the base region; a gate electrode buried inside a trench with a gate insulating film interposed; a base contact region of the second conductivity-type including silicon carbide having a 4H-structure provided on the top surface side of the drift layer; a semiconductor region including silicon carbide having a 4H-structure provided between the source contact region and the base contact region; and a main electrode provided to be in contact with the source contact region.

20 Claims, 20 Drawing Sheets

SILICON CARBIDE SEMICONDUCTOR DEVICE

CROSS-REFERENCE TO RELATED APPLICATION

This application claims benefit of priority under 35 USC 119 based on Japanese Patent Application No. 2023-044020 filed on Mar. 20, 2023, the entire contents of which are incorporated by reference herein.

BACKGROUND OF THE INVENTION

1. Field of the Invention

The present invention relates to silicon carbide semiconductor devices.

2. Description of the Related Art

JP 2009-049198 A discloses a semiconductor device including an amorphous layer obtained by implantation of impurity ions into a silicon carbide substrate of hexagonal single crystals, and an electrode obtained such that the amorphous layer is subjected to annealing to be recrystallized into n-type silicon carbide of cubic single crystals so as to vapor-deposit nickel on the top surface of the n-type silicon carbide.

WO 2017/042963 A1 discloses a semiconductor device including an epitaxially-grown layer of $n^-$-type grown on a first main surface of an $n^+$-type SiC substrate including 4H—SiC, an $n^+$-type source region formed in the n-type epitaxially-grown layer, and an $n^+$-type 3C—SiC region and a $p^+$-type potential fixing region each formed in the $n^+$-type source region, in which a barrier metal film is formed in contact with the $n^+$-type 3C—SiC region and the $p^+$-type potential fixing region, and a source wiring electrode is further formed on the barrier metal film.

A study of trench-gate silicon carbide semiconductor devices has been promoted that have a configuration in which a source region (a main region) includes 3C—SiC so as to be in ohmic contact with a source electrode (a main electrode). Such a trench-gate silicon carbide semiconductor device can be rationally manufactured such that a conductivity of a part of an $n^+$-type source region is inverted (turned back) by implantation of p-type impurity ions by use of a mask after the source region is formed on the entire surface by implantation of n-type impurity ions so as to form a $p^+$-type base contact region.

This manufacturing method, however, tends to cause a lot of damage to the turned-back part of the source region, leading to a leakage defect accordingly.

SUMMARY OF THE INVENTION

In view of the foregoing problems, the present invention provides a trench-gate silicon carbide semiconductor device having a configuration capable of leading a main region to be in ohmic contact with a main electrode without a silicide layer interposed and further avoiding a leakage defect.

An aspect of the present invention inheres in a silicon carbide semiconductor device including: a drift layer of a first conductivity-type including silicon carbide; a base region of a second conductivity-type including silicon carbide provided on a top surface side of the drift layer; a source contact region of the first conductivity-type including silicon carbide having a 3C-structure provided on a top surface side of the base region; a gate insulating film provided inside a trench penetrating the source contact region and the base region; a gate electrode buried inside the trench with the gate insulating film interposed; a base contact region of the second conductivity-type including silicon carbide having a 4H-structure provided on the top surface side of the drift layer and having a higher impurity concentration than the base region; a semiconductor region including silicon carbide having a 4H-structure provided between the source contact region and the base contact region; and a main electrode provided to be in contact with the source contact region.

DETAILED DESCRIPTION

Figure 1:
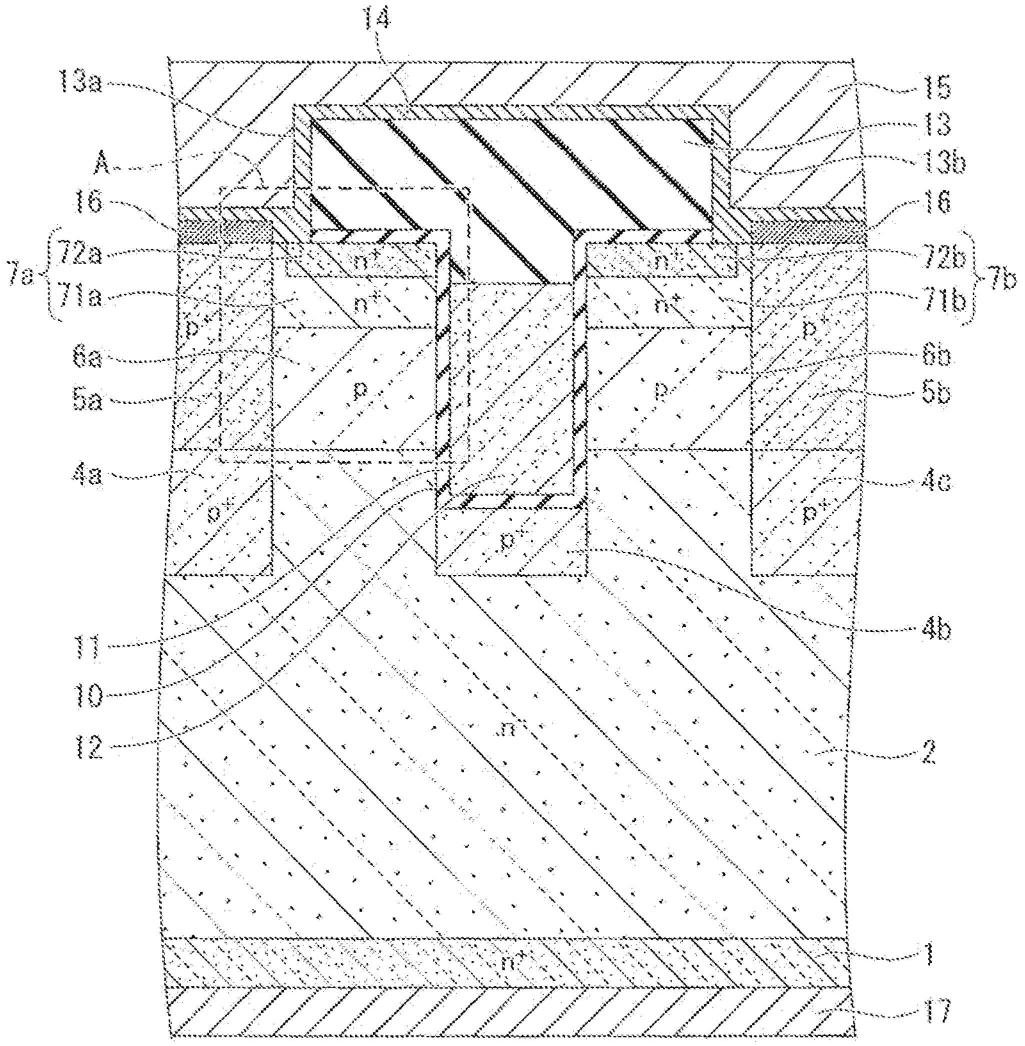
FIG. 1 is a schematic cross-sectional view illustrating an example of a silicon carbide semiconductor device according to a first embodiment.

With reference to the drawings, first to fourth embodiments of the present invention will be described below.

In the drawings, the same or similar elements are indicated by the same or similar reference numerals, and overlapping explanations are not repeated. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first to fourth embodiments described below merely illustrate schematically devices and methods for specifying and giving shapes to the technical idea of the present invention, and the span of the technical idea is not limited to materials, shapes, structures, and relative positions of elements described herein.

As used in the present specification, a source region of a metal-oxide-semiconductor field-effect transistor (MOSFET) is referred to as "one of the main regions (a first main region)" that can be used as an emitter region of an insulated gate bipolar transistor (IGBT). The "one of the main regions", when provided in a thyristor such as a MOS controlled static induction thyristor (SI thyristor), can be used as a cathode region. A drain region of the MOS transistor is referred to as the "other one of the main regions (a second main region)" of the semiconductor device that can be used as a collector region in the IGBT or as an anode region in the thyristor. The term "main region", when simply mentioned in the present specification, is referred to as either the first main region or the second main region that is determined as appropriate by the person skilled in the art.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. In addition, an "upper surface" may be read as "front surface", and a "lower surface" may be read as "back surface".

Further, in the following description, there is exemplified a case where a first conductivity-type is an n-type and a second conductivity-type is a p-type. However, the relationship of the conductivity types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

In addition, a crystal polymorphism is present in silicon carbide (SiC) crystals, and main examples include 3C of a cubic crystal, and 4H and 6H of a hexagonal crystal. A bandgap at room temperature is reported that is 2.23 eV in SiC of 3C-structure (3C—SiC), 3.26 eV in SiC having 4H-structure (4H—SiC), and 3.02 eV in SiC having 6H-structure (6H—SiC). The following embodiments are illustrated with a case of mainly using 4H—SiC and 3C—SiC.

First Embodiment

<Structure of Silicon Carbide Semiconductor Device>

A silicon carbide semiconductor device according to a first embodiment is illustrated below with a case of including a trench-gate vertical MOSFET as an active element, as illustrated in FIG. 1. While FIG. 1 illustrates a unit cell including an insulated gate electrode structure (11, 12) buried in a single trench 10, the silicon carbide semiconductor device actually includes the plural unit cells repeatedly arranged.

The silicon carbide semiconductor device according to the first embodiment includes a drift layer 2 of a first conductivity-type (n-type). The drift layer 2 is an epitaxially-grown layer including SiC such as 4H—SiC, for example. The drift layer 2 has an impurity concentration in a range of about $1\times10^{15}$ cm$^{-3}$ or greater and $5\times10^{16}$ cm$^{-3}$ or less, for example. The drift layer 2 has a thickness in a range of about 1 micrometer or greater and 100 micrometers or smaller, for example. The impurity concentration and the thickness of the drift layer 2 can be adjusted as appropriate depending on the breakdown voltage specifications, for example.

Base regions **6*a* and 6*b* of a second conductivity-type (p-type) are deposited on the top surface side of the drift layer 2. The respective bottom surfaces of the base regions 6*a* and 6*b* are in contact with the top surface of the drift layer 2. The base regions 6*a* and 6*b* are each a region including SiC such as 4H—SiC obtained such that p-type impurity ions are implanted into the drift layer 2. The base regions 6*a* and 6*b* may each be an epitaxially-grown layer including SiC such as 4H—SiC epitaxially grown on the top surface of the drift layer 2. The respective base regions 6*a* and 6*b*** have an impurity concentration in a range of about $1\times10^{16}$ cm$^{-3}$ or greater and $1\times10^{18}$ cm$^{-3}$ or less.

A current spreading layer (CSL) of the first conductivity-type (n-type) having a higher impurity concentration than the drift layer 2 may be provided between the drift layer 2 and the respective base regions **6*a* and 6*b*. The top surface of the drift layer 2 is in contact with the bottom surface of the current spreading layer when provided, and the top surface of the current spreading layer is in contact with the respective bottom surfaces of the base regions 6***a* and 6*b*.

First main regions (source regions) 7*a* and 7*b* of the first conductivity-type ($n^+$-type) having a higher impurity concentration than the drift layer 2 are selectively deposited on the top surface side of the base regions 6*a* and 6*b*. The source regions 7*a* and 7*b* are each a region including SiC obtained such that n-type impurity ions are implanted into the drift layer 2, for example.

The source region 7*a* includes a source expansion region (a first region) 71*a* of $n^+$-type with the bottom surface in contact with the top surface of the base region 6*a*, and a source contact region (a second region) 72*a* of $n^+$-type provided partly in the upper part (on the top surface side) of the source expansion region 71*a*. The source region 7*b* includes a source expansion region (a first region) 71*b* of $n^+$-type with the bottom surface in contact with the top surface of the base region 6*b*, and a source contact region (a second region) 72*b* of $n^+$-type provided partly in the upper part (on the top surface side) of the source expansion region 71*b*. The respective source regions 7*a* and 7*b* are described in detail below.

The trench 10 is provided from the respective top surfaces of the source regions 7*a* and 7*b* in the normal direction with respect to the respective top surfaces of the source regions 7*a* and 7*b* (in the depth direction) to penetrate the source regions 7*a* and 7*b* and the base regions 6*a* and 6*b*. The bottom surface of the trench 10 reaches the drift layer 2. The bottom surface of the trench 10 reaches the current spreading layer when provided. The trench 10 has a width of about one micrometer or smaller, for example. The source region 7*a* and the base region 6*a* are in contact with the side surface of the trench 10 on the left side. The source region 7*b* and the base region 6*b* are in contact with the side surface of the trench 10 on the right side. While FIG. 1 illustrates the case in which the bottom surface and the respective side surfaces of the trench 10 make the angular corners, the bottom surface of the trench 10 may be a curved surface instead.

A gate insulating film 11 is provided along the bottom surface and the side surfaces on both sides of the trench 10. A gate electrode 12 is buried inside the trench 10 with the gate insulating film 11 interposed. The gate insulating film 11 and the gate electrode 12 implement a trench-gate insulated gate electrode structure (11, 12).

The gate insulating film 11 as used herein can be a single film of a silicon oxide ($SiO_2$) film, a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film, or a composite film including some of the above films stacked on one another. The gate electrode 12 can be made of a polysilicon layer (a doped polysilicon layer) heavily doped with p-type or n-type impurity ions, or made of a layer including refractory metal such as titanium (Ti), tungsten (W), or nickel (Ni), for example.

A gate protection region 4*b* of the second conductivity-type ($p^+$-type) is provided at the bottom of (under) the trench 10 inside the drift layer 2. The top surface of the gate protection region 4*b* is in contact with the bottom surface of the trench 10. The top surface of the gate protection region 4*b* is not necessarily in contact with the bottom surface of the trench 10. The gate protection region 4*b* is a region including SiC such as 4H—SiC obtained such that p-type impurity ions are implanted into the drift layer 2, for example. The gate protection region 4*b* has an impurity concentration in a range of about $1\times10^{17}$ $cm^{-3}$ or greater and $1\times10^{19}$ $cm^{-3}$ or less, for example.

The drift layer 2 is further provided inside with buried regions 4*a* and 4*c* of the second conductivity-type ($p^+$-type) separately from the gate protection region 4*b*. The buried regions 4*a* and 4*c* are located at substantially the same depth as the gate protection region 4*b*. The buried regions 4*a* and 4*c* are each a region including SiC such as 4H—SiC obtained such that p-type impurity ions are implanted into the drift layer 2, for example. The respective buried regions 4*a* and 4*c* have an impurity concentration in a range of about $1\times10^{17}$ $cm^{-3}$ or greater and $1\times10^{19}$ $cm^{-3}$ or less, for example. A semiconductor region of $p^+$-type for connecting the respective buried regions 4*a* and 4*c* and the gate protection region 4*b* together may be selectively provided on the front side or the back side in the sheet of FIG. 1.

Base contact regions 5*a* and 5*b* of the second conductivity-type ($p^+$-type) having a higher impurity concentration than the base regions 6*a* and 6*b* are provided on the top surface side of the buried regions 4*a* and 4*c* at the upper part of the drift layer 2. The base contact regions 5*a* and 5*b* are each a region including SiC such as 4H—SiC obtained such that p-type impurity ions are implanted into the drift layer 2, for example. The base contact regions 5*a* and 5*b* have an impurity concentration in a range of about $1\times10^{18}$ $cm^{-3}$ or greater and $1\times10^{21}$ $cm^{-3}$ or less, for example. The respective bottom surfaces of the base contact regions 5*a* and 5*b* may have substantially the same depth as the respective bottom surfaces of the base regions 6*a* and 6*b*, or may be either shallower than or deeper than those of the base regions 6*a* and 6*b*.

The bottom surface of the base contact region 5*a* is in contact with the top surface of the buried region 4*a*. When the bottom surface of the base contact region 5*a* is shallower than the bottom surface of the base region 6*a*, a base region 6 is provided between the bottom surface of the base contact region 5*a* and the buried region 4*a*. The side surface of the base contact region 5*a* is in contact with the base region 6*a* and the source expansion region 71*a* of the source region 7*a*. A part of the source expansion region 71*a* that is a semiconductor region including 4H—SiC is interposed between the side surface of the base contact region 5*a* and the side surface of the source contact region 72*a* of the source region 7*a*. The source expansion region 71*a* has an L-shape in cross section.

The bottom surface of the base contact region 5*b* is in contact with the top surface of the buried region 4*b*. When the bottom surface of the base contact region 5*b* is shallower than the bottom surface of the base region 6*b*, the base region 6 is provided between the bottom surface of the base contact region 5*b* and the buried region 4*c*. The side surface of the base contact region 5*b* is in contact with the base region 6*b* and the source expansion region 71*b* of the source region 7*b*. A part of the source expansion region 71*b* that is a semiconductor region including 4H—SiC is interposed between the side surface of the base contact region 5*b* and the side surface of the source contact region 72*b* of the source region 7*b*. The source expansion region 71*b* has an L-shape in cross section.

An interlayer insulating film 13 is deposited on the top surface side of the gate electrode 12. The interlayer insulating film 13 is a single-layer film, such as a borophosphosilicate glass film (a BPSG film), a phosphosilicate glass film (a PSG film), a non-doped silicon oxide film without containing phosphorus (P) or boron (B) which is referred to as a non-doped silicate glass (NSG) film, a borosilicate glass film (a BSG film), or a silicon nitride ($Si_3N_4$) film, or a stacked-layer film including the above films stacked on one another. The interlayer insulating film 13 is provided with contact holes 13*a* and 13*b* to which the respective top surfaces of the source expansion regions 71*a* and 71*b*, the source contact regions 72*a* and 72*b* and the base contact regions 5*a* and 5*b* are at least partly exposed.

A first main electrode (a source electrode) (14, 15, 16) is provided to cover the interlayer insulating film 13, and further the source expansion regions 71*a* and 71*b*, the source contact regions 72*a* and 72*b*, and the base contact regions 5*a* and 5*b* exposed to the contact holes 13*a* and 13*b* of the interlayer insulating film 13. The source electrode (14, 15, 16) includes a barrier metal layer 14, a source wiring layer 15, and a silicide layer 16.

The silicide layer 16 is provided selectively on the respective top surfaces of the base contact regions 5*a* and 5*b* so as to be in ohmic contact with the base contact regions 5*a* and 5*b* at a low resistance. The silicide layer 16 includes silicide such as nickel silicide ($NiSi_x$). The source electrode (14, 15, 16) may only include the barrier metal layer 14 and the source wiring layer 15 without the silicide layer 16.

The barrier metal layer 14 is provided to cover the interlayer insulating film 13, and further the source expansion regions 71*a* and 71*b*, the source contact regions 72*a* and 72*b*, and the silicide layer 16 exposed to the contact holes 13*a* and 13*b*. The barrier metal layer 14 is directly in contact with the source expansion regions 71*a* and 71*b* and the source contact regions 72*a* and 72*b*. The barrier metal layer 14 is in ohmic contact with the source contact regions 72*a* and 72*b* having a 3C-structure at a low resistance, but is not in ohmic contact with the source expansion regions 71*a* and 71*b* having a 4H-structure. The barrier metal layer 14 includes titanium nitride (TiN), titanium (Ti), or metal having a stacked-layer structure of TiN/Ti including Ti as a lower layer, for example.

The source wiring layer 15 is provided to cover the barrier metal layer 14. The source wiring layer 15 is electrically connected to the source contact regions 72*a* and 72*b* and the base contact regions 5*a* and 5*b*. The source wiring layer 15 includes metal or an alloy, such as aluminum (Al), aluminum-silicon (Al—Si), aluminum-copper (Al—Cu), and copper (Cu), for example. The source wiring layer 15 is provided separately from a gate wiring electrode (not illustrated) electrically connected to the gate electrode 12.

A second main region (a drain region) 1 of the first conductivity-type ($n^+$-type) having a higher impurity concentration than the drift layer 2 is deposited on the bottom surface side of the drift layer 2. The drain region 1 is made of a semiconductor substrate (a SiC substrate) including SiC such as 4H—SiC, for example. The drain region 1 has an impurity concentration in a range of about $1\times10^{19}$ $cm^{-3}$ or greater and $3\times10^{20}$ $cm^{-3}$ or less, for example. The drain region 1 has a thickness in a range of about 30 micrometers or greater and 500 micrometers or smaller, for example. A dislocation conversion layer or a recombination promotion layer having a higher impurity concentration than the drift layer 2 and having a lower impurity concentration than the drain region 1 may be provided as an n-type buffer layer between the drift layer 2 and the drain region 1.

A second main electrode (a drain electrode) 17 is deposited on the bottom surface side of the drain region 1. The drain electrode 17 can be a single-layer film including gold (Au), or a metallic film including titanium (Ti), nickel (Ni), and Au stacked in this order from the drain region 1 side, and may be further provided with a metallic film including molybdenum (Mo) or tungsten (W) as the lowermost layer, for example. A drain contact layer such as a nickel silicide ($NiSi_x$) layer for ensuring an ohmic contact may be provided between the drain region 1 and the drain electrode 17.

Figure 2:
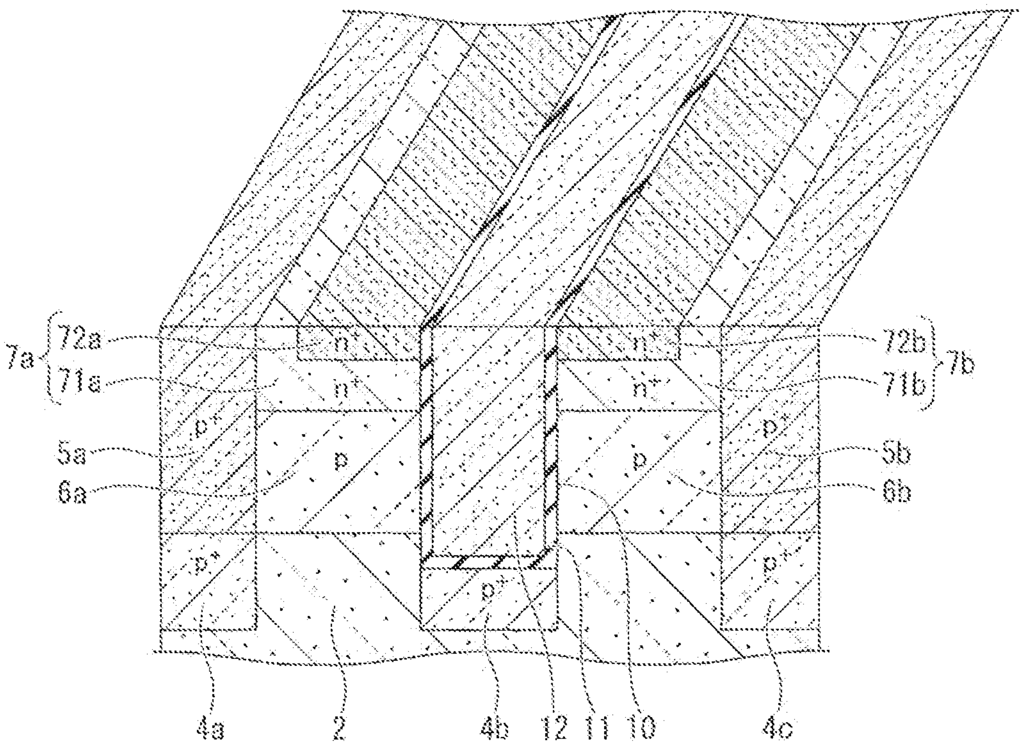
FIG. 2 is a schematic perspective view illustrating the example of the silicon carbide semiconductor device according to the first embodiment.

FIG. 2 is a schematic perspective view extracting a part of the semiconductor device according to the first embodiment illustrated in FIG. 1. As illustrated in FIG. 2, the trench 10 has a shape extending in a stripe state in a planar pattern. The trench 10 is not limited to the stripe-shaped planar pattern, and may have a dot-like planar pattern instead, for example. The source expansion regions 71*a* and 71*b*, the source contact regions 72*a* and 72*b*, and the base contact regions 5*a* and 5*b* each have a planar pattern extending in a stripe state parallel to the trench 10.

Figure 3:
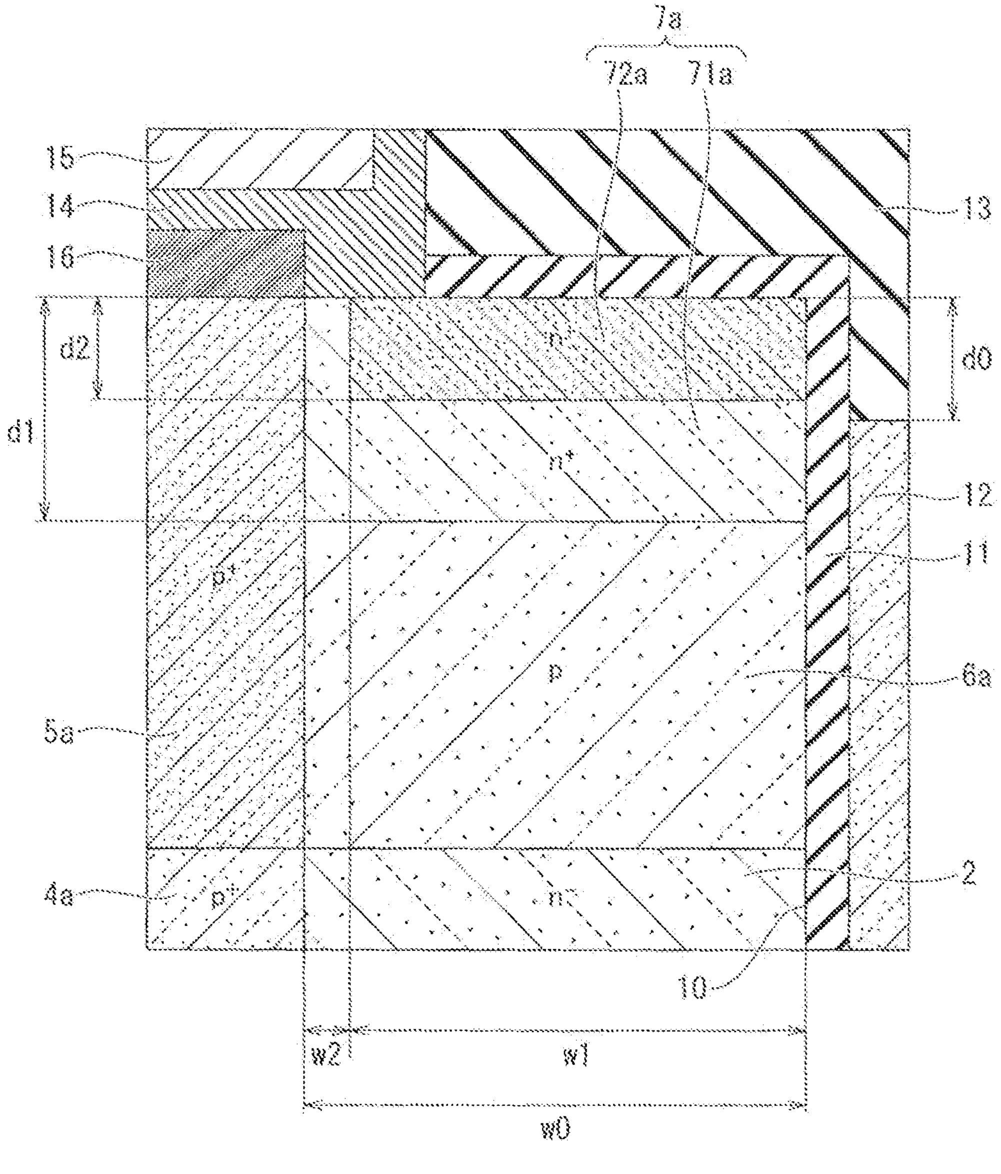
FIG. 3 is a schematic enlarged cross-sectional view of region A in FIG. 1.

FIG. 3 is a schematic enlarged cross-sectional view illustrating region A of the semiconductor device according to the first embodiment indicated by the broken line shown in FIG. 1. The structure regarding the source expansion region 71*a* and the source contact region 72*a* and the positional relation between the source expansion region 71*a*, the source contact region 72*a*, the base contact region 5*a*, and the insulated gate electrode structure (11, 12) are described below with reference to FIG. 3.

A depth d1 from the top surface to the bottom surface of the source expansion region 71*a* (that is a thickness of the source expansion region 71*a*) is in a range of about 150 nanometers or greater and 450 nanometers or smaller, for example. A width (w1+w2) of the source expansion region 71*a* is in a range of about 400 nanometers or greater and 1000 nanometers or smaller, for example. The side surface of the source expansion region 71*a* on the right side is directly in contact with the gate insulating film 11 so as to be opposed to the gate electrode 12 with the gate insulating film 11 interposed.

The source expansion region 71*a* is a part having fewer crystal defects than the source contact region 72*a* and not taking over the crystal defects from the source contact region 72*a*. The source expansion region 71*a* mainly includes 4H—SiC (a 4H-structure). The proportion of 4H—SiC included in the source expansion region 71*a* is in a range of about 90% or greater and 100% or smaller, for example. The source expansion region 71*a* may further include an amorphous structure and a small amount of 3C—SiC in addition to 4H—SiC, for example. The impurity concentration of the source expansion region 71*a* is in a range of about $1\times10^{16}$ $cm^{-3}$ or greater and $1\times10^{20}$ $cm^{-3}$ or less, for example. The source expansion region 71*a* includes nitrogen (N) or phosphorus (P) as n-type impurity ions, for example. The source expansion region 71*a* may further include arsenic (As) as n-type impurity ions.

A depth d2 from the top surface to the bottom surface of the source contact region 72*a* (that is a thickness of the source contact region 72*a*) is in a range of about 30 nanometers or greater and 100 nanometers or smaller, for example. A width w1 of the contact region 72*a* is narrower than the width (w1+w2) of the source expansion region 71*a*, and is in a range of about 400 nanometers or greater and 1000 nanometers or smaller, for example.

The side surface of the source contact region 72*a* on the right side is directly in contact with the gate insulating film 11 so as to be opposed to the interlayer insulating film 13 with the gate insulating film 11 interposed. The side surface of the source contact region 72*a* on the left side is separated from the side surface of the base contact region 5*a* on the right side. A part of the source expansion region 71*a* is interposed between the side surface of the source contact region 72*a* on the left side and the side surface of the base contact region 5*a* on the right side. The width w2 of the part of the source expansion region 71*a* interposed between the side surface of the source contact region 72*a* on the left side and the side surface of the base contact region 5*a* on the right side is in a range of about 10 nanometers or greater and 500 nanometers or smaller, for example.

The source contact region 72*a* is a part including 3C—SiC (a 3C-structure). The proportion of 3C—SiC included in the source contact region 72*a* is higher than that in the source expansion region 71*a*, and is in a range of about 10% or greater and 100% or smaller, for example. The source contact region 72*a* may have a mixed-crystal structure of 3C—SiC and 4H—SiC. The source contact region 72*a* may further include an amorphous structure and 4H—SiC in addition to 3C—SiC, for example. The source contact region 72*a* when including 3C—SiC, which has a narrower bandgap than 4H—SiC, can be led to be in ohmic contact with the source electrode (14, 15, 16) at a low resistance without the silicide layer 16 interposed. To achieve a good ohmic contact with the source electrode (14, 15, 16), the proportion of 3C—SiC included in the source contact region 72*a* is preferably 10% or greater.

The source contact region 72*a* has a higher impurity concentration than the source expansion region 71*a*, or has substantially the same impurity concentration as the source expansion region 71*a*. The impurity concentration of the source contact region 72*a* is in a range of about $1\times10^{20}$ $cm^{-3}$ or greater and $1\times10^{22}$ $cm^{-3}$ or less, for example. The source contact region 72*a* includes phosphorus (P) or arsenic (As) as n-type impurity ions, for example. The source contact region 72*a* may further include nitrogen (N) as n-type impurity ions. The source contact region 72*a* may include some of P, As, and N combined as appropriate as n-type impurity ions. The source contact region 72*a* may include an inactive element such as argon (Ar) or helium (He), for example.

The respective crystal structures of the source expansion region 71*a* and the source contact region 72*a* can be formed independently of each other such that some conditions such as the element to be implanted, the temperature during the ion implantation, the dose (the impurity concentration), and the activation temperature are changed for each of the source expansion region 71*a* and the source contact region 72*a*. The source contact region 72*a* including 3C—SiC is formed, for example, such that n-type impurity ions or an inactive element is implanted to 4H—SiC at a room temperature at a high impurity concentration (with a high dose) so as to destroy 4H—SiC to form an amorphous structure by use of damage during the ion implantation. The activation annealing is then executed to lead the amorphous structure to turn to 3C—SiC when recrystallized, so as to form the source contact region 72*a* including 3C—SiC accordingly.

The source expansion region 71*a* including 4H—SiC is formed such that n-type impurity ions are implanted to 4H—SiC either at a room temperature or at a high temperature (for example, in a range of about 200° C. or higher and 600° C. or lower) at an impurity concentration (with a dose) that can sufficiently avoid destruction of the structure of 4H—SiC so as to keep 4H—SiC. The source expansion region 71*a* includes aluminum (Al) or boron (B) as p-type impurity ions, for example.

The respective crystal structures of the source expansion region 71*a* and the source contact region 72*a* can be measured (observed) such that a ratio of the areas of the crystal structures on the surfaces is measured by use of a field-emission scanning electron microscope (FE-SEM) and electron backscatter diffraction (EBSD). The present embodiment executed the measurement, as an example, such that samples were prepared under the common conditions of the impurity ions to be implanted, the dose (the impurity concentration), and the activation temperature, while the different temperatures were used upon the ion implantation that were 500° C. and a room temperature (25° C.), so as to be measured by use of the FE-SEM and the EBSD. The proportion of 4H—SIC on the surface in the sample obtained at 500° C. was 100%. The proportion of 4H—SiC on the surface in the sample obtained at the room temperature was 86%, while the proportion of 3C—SiC was 14%.

The method of forming the base contact region 5*a* including 4H—SiC is the same as the method of forming the source expansion region 71*a* including 4H—SiC. The base contact region 5*a* including 4H—SiC can be formed such that p-type impurity ions are implanted to 4H—SiC either at a room temperature or at a high temperature (for example, in a range of about 200° C. or higher and 600° C. or lower) at an impurity concentration (with a dose) that can sufficiently avoid destruction of the structure of 4H—SiC so as to keep 4H—SiC.

As illustrated in FIG. 3, the end of the top surface (the upper end) of the gate electrode 12 in contact with the gate insulating film 11 is located at a position deeper than the bottom surface (the lower end) of the source contact region 72*a* at a part in contact with the gate insulating film 11 and shallower than the bottom surface (the lower end) of the source expansion region 71*a* at a part in contact with the gate insulating film 11. The top surface of the gate electrode 12 at the part in contact with the gate insulating film 11 may be the uppermost surface of the gate electrode 12. For example, when the entire top surface of the gate electrode 12 is concave, the top surface in the middle of the gate electrode 12 may be located at a position deeper than the top surface at the end part of the gate electrode 12.

The gate electrode 12 is opposed to the source expansion region 71*a* with the gate insulating film 11 interposed, while the gate electrode 12 and the source contact region 72*a* are not opposed to each other. The source contact region 72*a* is opposed to the interlayer insulating film 13 with the gate insulating film 11 interposed. A drop amount do of the gate electrode 12 from the top surface of the source contact region 72*a* is in a range of about 100 nanometers or greater and 300 nanometers or smaller, for example. The drop amount do of the gate electrode 12 and the top surface of the gate electrode 12 at the position in contact with the gate insulating film 11 can be adjusted such that the etching conditions used for the gate electrode 12 are regulated, for example.

The end of the top surface (the upper end) of the gate electrode 12 in contact with the gate insulating film 11 may be shallower than the bottom surface (the lower end) of the source contact region 72*a* at the part in contact with the gate insulating film 11 instead.

The source expansion region 71*b* and the source contact region 72*b* of the source region 7*b* illustrated in FIG. 1 have the configurations common to those of the source expansion region 71*a* and the source contact region 72*a* of the source region 7*a*, respectively, and overlapping explanations are not repeated below. The positional relation between the source expansion region 71*b* and the source contact region 72*b* of the source region 7*b*, the base contact region 5*b*, and the insulated gate electrode structure (11, 12) is also common to that between the source expansion region 71*a* and the source contact region 72*a* of the source region 7*a*, the base contact region 5*a*, and the insulated gate electrode structure (11, 12) illustrated in FIG. 3, and overlapping explanations are not repeated below.

The silicon carbide semiconductor device according to the first embodiment during the switching operation applies a positive voltage to the drain electrode 17 while using the source electrode (14, 15, 16) as a ground potential, and causes an inversion layer (a channel) to be formed in the respective base regions 6*a* and 6*b* toward the side surfaces of the trench 10 so as to be in the ON-state when a positive voltage of a threshold or greater is applied to the gate electrode 12. In the ON-state, a current flows from the drain electrode 17 toward the source electrode (14, 15, 16) through the drain region 1, the drift layer 2, the respective inversion layers of the base regions 6*a* and 6*b*, and the source regions 7*a* and 7*b*. When the voltage applied to the gate electrode 12 is smaller than the threshold, the silicon carbide semiconductor device is led to be in the OFF-state since no inversion layer is formed in the respective base regions 6*a* and 6*b*, while no current flows from the drain electrode 17 toward the source electrode (14, 15, 16).

The silicon carbide semiconductor device according to the first embodiment, in which the source contact regions 72*a* and 72*b* of the source regions 7*a* and 7*b* including 3C—SiC are in contact with the source electrode (14, 15, 16), can achieve the ohmic contact at a low resistance without the interposition of the silicide layer 16. The present embodiment thus can eliminate a problem of separation of the silicide layer 16 since the silicide layer 16 does not need to be provided on the contact joint surface of the respective source contact regions 72*a* and 72*b*.

Further, the silicon carbide semiconductor device according to the first embodiment has the configuration in which the source expansion regions 71*a* and 71*b* including 4H—SiC are interposed between the source contact regions 72*a* and 72*b* including 3C—SiC and the base contact regions 5*a* and 5*b* including 4H—SiC. This configuration can exclude damage derived from the ion implantation for the source expansion regions 71*a* and 71*b* to be formed in the base contact regions 5*a* and 5*b*, so as to avoid a leakage defect accordingly, as compared with a case in which the source contact regions 72*a* and 72*b* and the base contact regions 5*a* and 5*b* are in contact with each other.

Further, the silicon carbide semiconductor device according to the first embodiment, which has the configuration in which the respective source expansion regions 71*a* and 71*b* and the respective base contact regions 5*a* and 5*b* implementing the p-n junction both include 4H—SiC, can avoid a leak current at the p-n junction part, as compared with a case in which the source contact regions 72*a* and 72*b* including 3C—SiC with a large amount of crystal defects remaining and the base contact regions 5*a* and 5*b* including 4H—SiC implement the p-n junction.

Further, the silicon carbide semiconductor device according to the first embodiment has the configuration in which the top surface of the gate electrode 12 is located at a position deeper than the bottom surface of the source contact region 72*a* and shallower than the bottom surface of the source expansion region 71*a*. This configuration leads the source expansion region 71*a* of the source region 7*a* having a relatively small amount of crystal defects with less surface roughness to be opposed to the gate electrode 12 with the gate insulating film 11 interposed, while the source contact region 72*a* of the source region 7*a* having a relatively large amount of crystal defects with larger surface roughness is not opposed to the gate electrode 12. The configuration according to the first embodiment thus can suppress a cause of a leak current between the source region 7*a* and the gate electrode 12.

<Method of Manufacturing Silicon Carbide Semiconductor Device>

An example of a method of manufacturing the silicon carbide semiconductor device according to the first embodiment is described below. It should be understood that the method of manufacturing the silicon carbide semiconductor device described below is an example, and the silicon carbide semiconductor device can be manufactured by other methods including modified examples of this embodiment within the scope of the appended claims.

First, the semiconductor substrate (the SiC substrate) 1 of $n^+$-type (refer to FIG. 4) including SiC such as 4H—SiC doped with n-type impurity ions such as nitrogen (N) is prepared. The top surface of the SiC substrate 1 has an off-angle of three to eight degrees with respect to a {0001}-plane, for example. Next, as illustrated in FIG. 4, the drift layer 2 of $n^-$-type including SiC such as 4H—SiC doped with n-type impurity ions such as N and having a lower impurity concentration than the SiC substrate 1 is epitaxially grown on the top surface of the SiC substrate 1.

Figure 5:
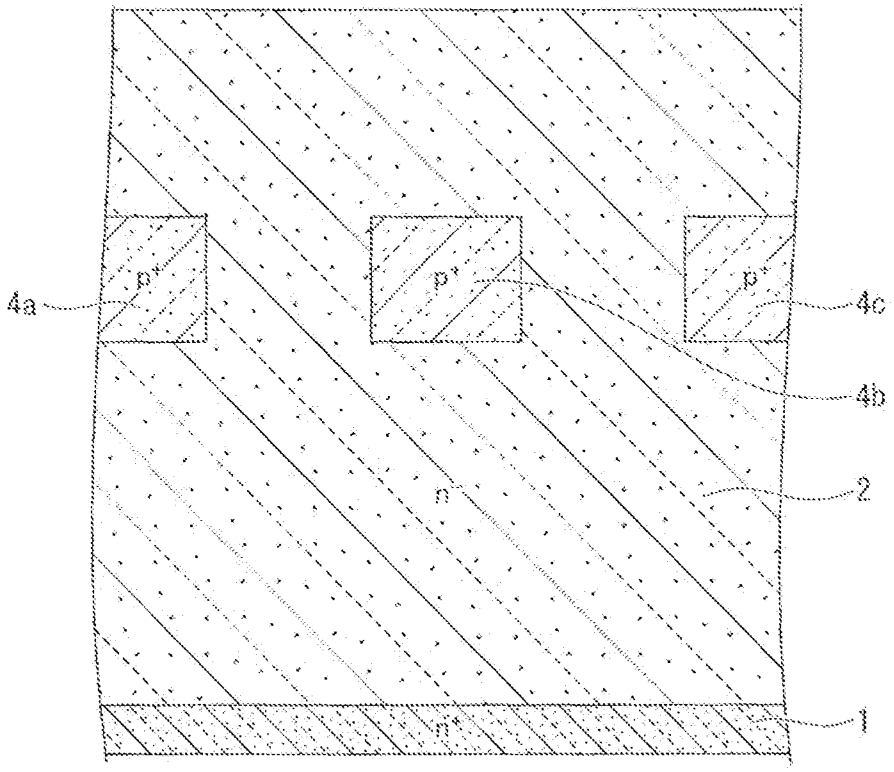
FIG. 5 is a schematic cross-sectional view continued from FIG. 4, for explaining the example of the method of manufacturing the silicon carbide semiconductor device according to the first embodiment.

Next, an oxide film is deposited on the top surface of the drift layer 2 by chemical vapor deposition (CVD), for example. A photoresist film is then applied to the top surface of the oxide film, and the oxide film is delineated by photolithography and dry etching, for example. Using the delineated oxide film as a mask for ion implantation, p-type impurity ions such as aluminum (Al) are selectively implanted. Instead of the oxide film, a photoresist film may be used as a mask for ion implantation. The oxide film used as the mask for ion implantation is then removed. This step provides the $p^+$-type buried regions 4*a* and 4*c* and the $p^+$-type gate protection region 4*b* selectively inside the drift layer 2, as illustrated in FIG. 5. A charge accumulation layer (a current spreading layer) is formed inside the drift layer 2 at this point, as necessary, by the selective implantation of n-type impurity ions.

Figure 4:
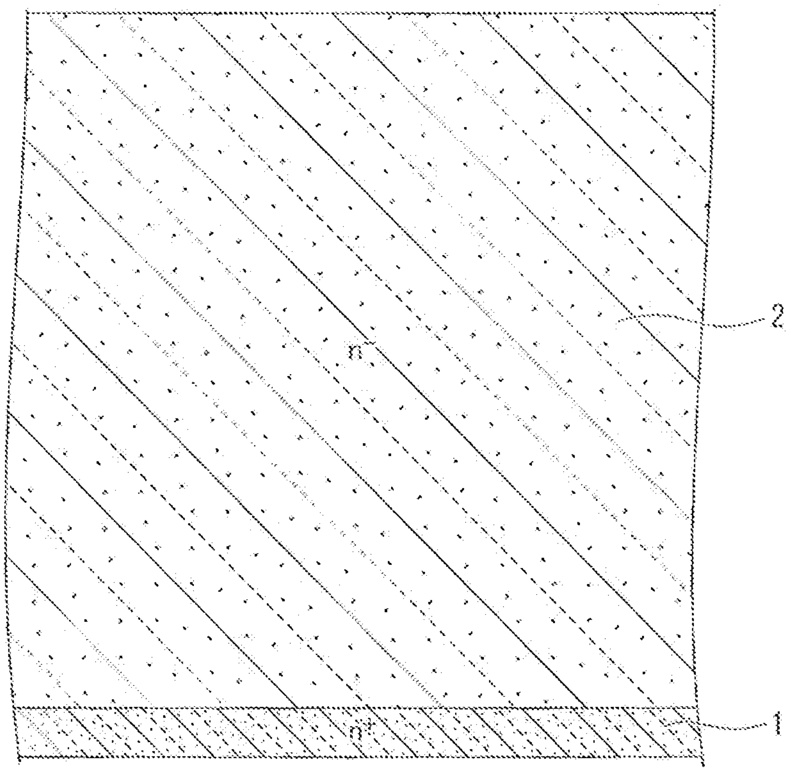
FIG. 4 is a schematic cross-sectional view for explaining an example of a method of manufacturing the silicon carbide semiconductor device according to the first embodiment.

Alternatively, the structure illustrated in FIG. 5 may be obtained such that the drift layer 2 is epitaxially grown to the middle (the lower part) illustrated in FIG. 4, and the rest (the upper part) of the drift layer 2 is further epitaxially grown after the $p^+$-type buried regions 4*a* and 4*c* and the $p^+$-type gate protection region 4*b* are formed by the ion implantation.

Figure 6:
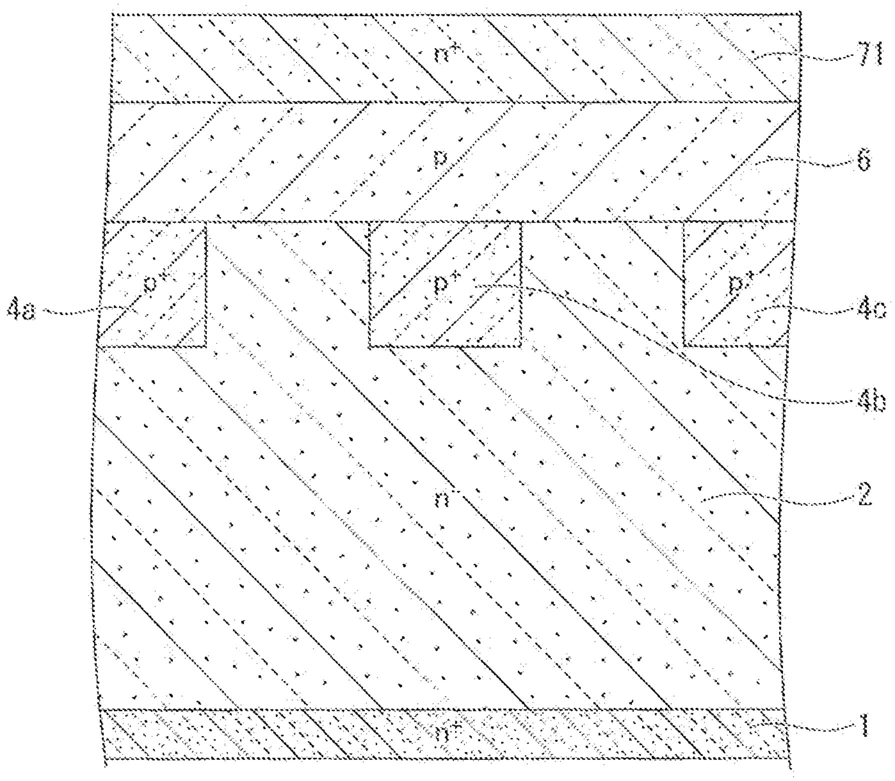
FIG. 6 is a schematic cross-sectional view continued from FIG. 5, for explaining the example of the method of manufacturing the silicon carbide semiconductor device according to the first embodiment.

Next, p-type impurity ions such as aluminum (Al) are implanted to the entire surface at a lower acceleration voltage than that during the ion implantation for forming the $p^+$-type buried regions 4*a* and 4*c* and the $p^+$-type gate protection region 4*b*. Further, n-type impurity ions such as nitrogen (N) are implanted to the entire surface at a lower acceleration voltage than that during the ion implantation for forming the base region 6. This step forms the p-type base region 6 including SiC such as 4H—SiC on the top surface side of the buried regions 4*a* and 4*c* and the gate protection region 4*b*, as illustrated in FIG. 6. In addition, the $n^+$-type source expansion region 71 including 4H—SiC is formed on the top surface side of the base region 6.

Upon the ion implantation for the source expansion region 71, phosphorus (P: element number 15) having a relatively small atomic number is preferably used, and nitrogen (N: element number 7) having a smaller atomic number is more preferably used, as the n-type impurity ions, in order to have less damage than the ion implantation for the source contact regions 72*a* and 72*b* described below. In addition to P or N, arsenic (As: element number 33) having a relatively large atomic number may be implanted. The temperature during the ion implantation in this step is set to be higher than the temperature during the ion implantation for the source contact regions 72*a* and 72*b* described below, and is in a range of 200° C. or higher and 600° C. or lower, for example. The dose of the impurity ions to be implanted is set such that the impurity concentration of the source expansion region 71 is in a range of about $1\times10^{16}$ $cm^{-3}$ or greater and $1\times10^{20}$ $cm^{-3}$ or less, for example. The dose of the impurity ions to be implanted is set to about less than $2\times10^{15}$ $cm^{-2}$, for example.

Figure 7:
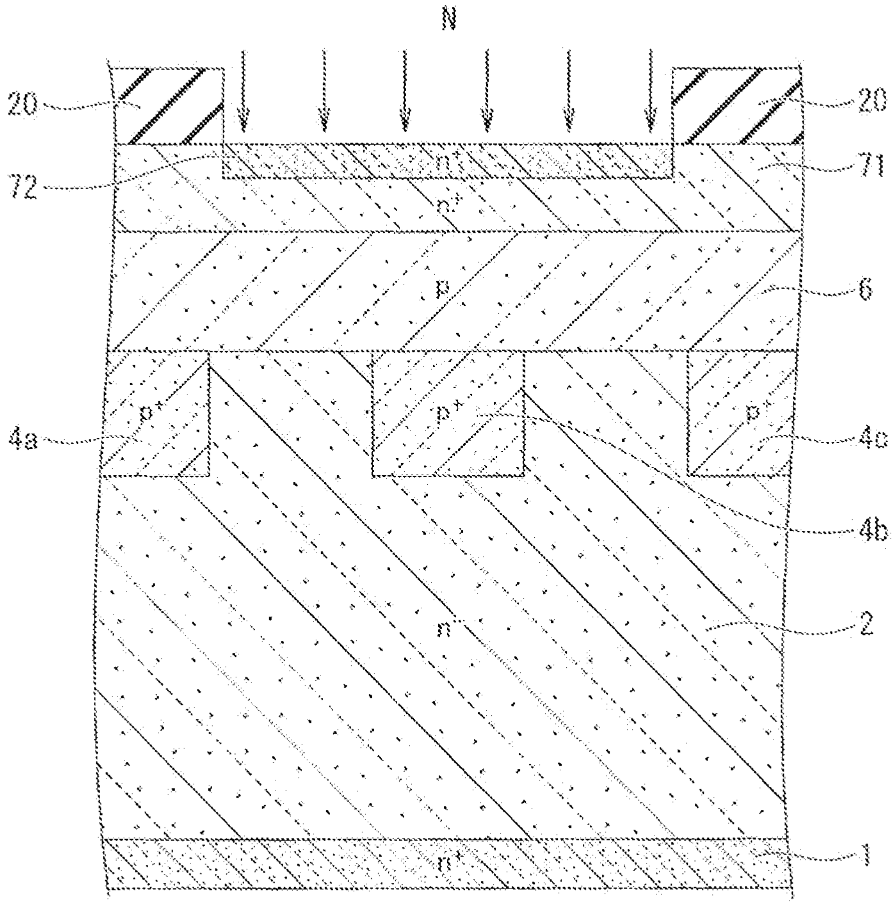
FIG. 7 is a schematic cross-sectional view continued from FIG. 6, for explaining the example of the method of manufacturing the silicon carbide semiconductor device according to the first embodiment.

Next, an oxide film 20 (refer to FIG. 7) is deposited on the top surface of the source expansion region 71 by CVD or the like. A photoresist film is then applied to the top surface of the oxide film 20, and the oxide film 20 is delineated by photolithography and dry etching. Using the delineated oxide film 20 as a mask for ion implantation, n-type impurity ions such as nitrogen (N) are selectively implanted, as illustrated in FIG. 7. Instead of the oxide film 20, a photoresist film may be used as a mask for ion implantation. This step selectively provides the $n^+$-type source contact region 72 in a part on the top surface side (at the upper part) of the source expansion region 71.

The execution of the ion implantation for the source contact region 72 breaks the structure of 4H—SiC on the top surface side of the source expansion region 71 so as to form the amorphous structure. While FIG. 7 illustrates the case of the implantation of nitrogen (N) as impurity ions, the use of P (element number 15) having a relatively large atomic number as the n-type impurity ions is preferable, and the use of arsenic (As: element number 33) having a greater atomic number is more preferable in order to have greater damage than the ion implantation for the source expansion region 71 described above. The same impurity ions as the impurity ions implanted for the source expansion region 71 described above may be implanted for the source contact region 72, or different impurity ions may be implanted instead. The temperature during the ion implantation in this step is set to be lower than the temperature during the ion implantation for the source expansion region 71 described above, and is in a range of 20° C. or higher and 150° C. or lower, for example. The total dose of the impurity ions to be implanted including the impurity ions implanted to the source expansion region 71 described above is determined such that the impurity concentration of the source contact region 72 is set in a range of about $1\times10^{20}$ $cm^{-3}$ or greater and $1\times10^{22}$ $cm^{-3}$ or less, for example. The total dose of the impurity ions to be implanted including the dose of the impurity ions implanted to the source expansion region 71 described above is set to about $2\times10^{15}$ $cm^{-2}$ or greater, for example Upon the ion implantation for the source contact region 72, an inactive element such as argon (Ar) or helium (He) may be implanted instead of the n-type impurity ions. The total dose of the inactive element to be implanted including the dose of the impurity ions implanted to the source expansion region 71 described above is set to about $2\times10^{15}$ $cm^{-2}$ or greater, for example. When the inactive element is used for the ion implantation, the source expansion region 71 and the source contact region 72 have substantially the same impurity concentration, since the implantation of the n-type impurity ions is only executed for the source expansion region 71. The oxide film 20 used as the mask for ion implantation is removed after the ion implantation for the source contact region 72.

Figure 8:
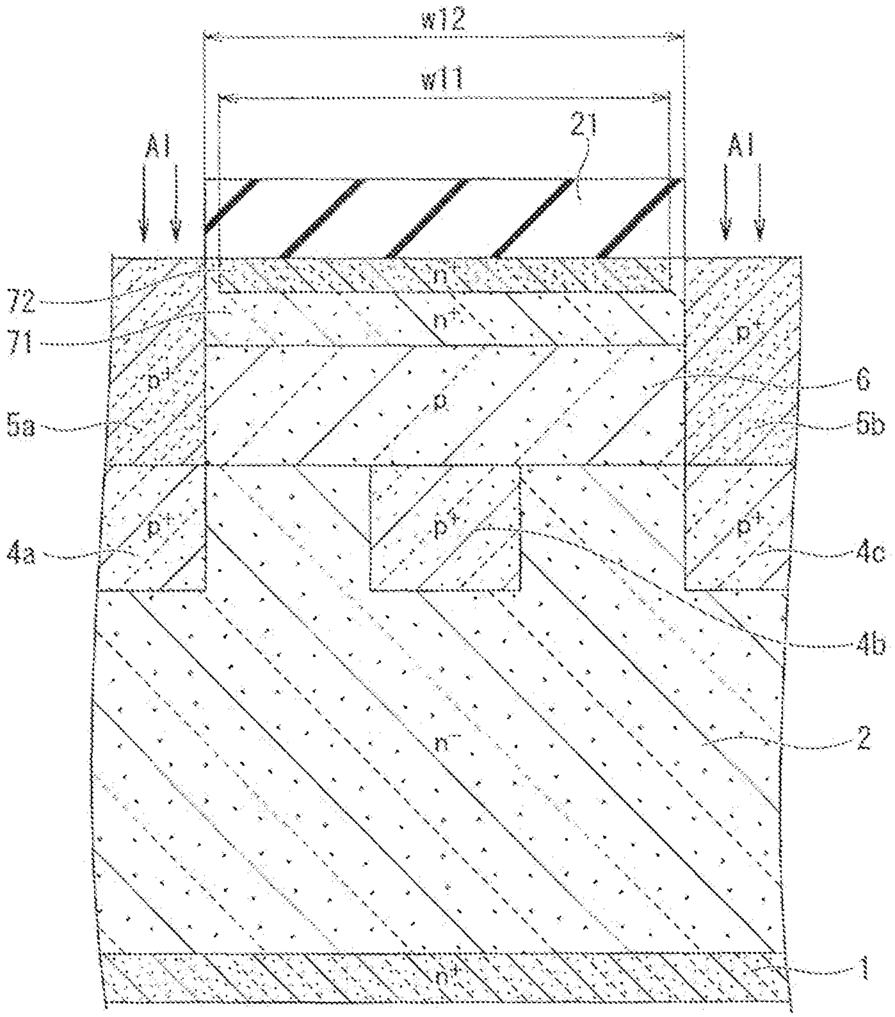
FIG. 8 is a schematic cross-sectional view continued from FIG. 7, for explaining the example of the method of manufacturing the silicon carbide semiconductor device according to the first embodiment.

Next, an oxide film 21 (refer to FIG. 8) is deposited on the top surface of the base region 6 by CVD or the like. A photoresist film is then applied to the top surface of the oxide film 21, and the oxide film 21 is delineated by photolithography and dry etching. A width w11 of the source contact region 72 is narrower than a width w12 of the mask pattern of the oxide film 21 covering the top surface of the source contact region 72 (refer to FIG. 8). Using the delineated oxide film 21 as a mask for ion implantation, p-type impurity ions such as aluminum (Al) or boron (B) are selectively implanted, as illustrated in FIG. 8, so as to invert (turn back) the conductivity of a part of the source expansion region 71 from the n-type to the p-type. This step selectively provides the $p^+$-type base contact regions 5*a* and 5*b* including 4H—SiC on the top surface side of the buried regions 4*a* and 4*c*. The base contact regions 5*a* and 5*b* are separated from the source contact region 72 but are in contact with the source expansion region 71 and the base region 6. Instead of the oxide film 21, a photoresist film may be used as a mask for ion implantation. The oxide film 21 used as the mask for ion implantation is then removed.

The order of executing the ion implantation for forming the base region 6, the ion implantation for forming the source expansion region 71, the ion implantation for forming the source contact region 72, and the ion implantation for forming the base contact regions 5*a* and 5*b* is not limited to the case described above, and may be changed as appropriate. For example, the ion implantation for forming the source contact region 72 may be executed after the ion implantation form forming the base contact regions 5*a* and 5*b*.

Next, activation annealing (heat treatment) is executed by use of an annealing furnace or the like at a temperature of about 1600° C. or higher and 1900° C. or lower, for example, so as to collectively activate the p-type impurity ions or the n-type impurity ions implanted into the buried regions 4*a* and 4*c*, the gate protection region 4*b*, the source expansion region 71, the source contact region 72, the base contact regions 5*a* and 5*b*, and the like. At this point, the amorphous structure in the source contact region 72 is recrystallized to turn to 3C—SiC, so as to form the source contact region 72 including 3C—SiC.

While the present embodiment is illustrated with the case in which the single activation annealing is collectively executed after all of the ion implantation steps, the activation annealing may be executed several times independently after each of the ion implantation steps. Alternatively, the present embodiment may include a process of forming a cap film including carbon (C), executing the activation annealing with the cap film formed, and then removing the cap film after the activation annealing.

Figure 9:
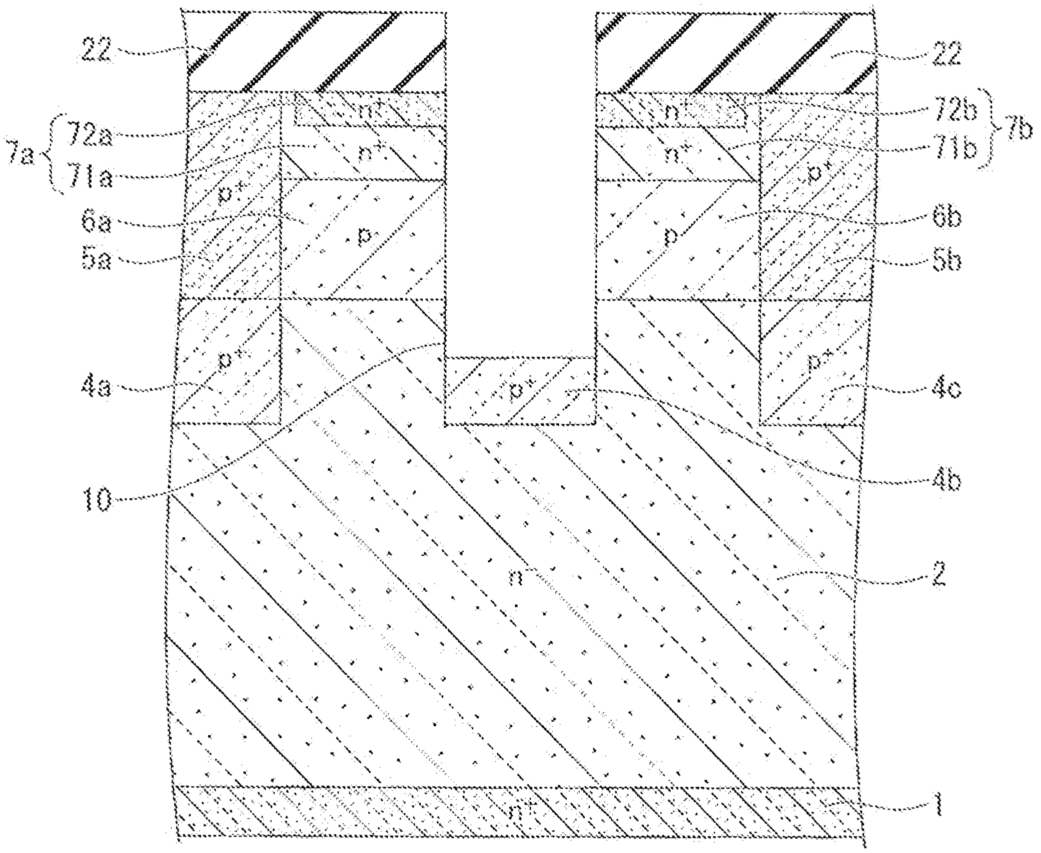
FIG. 9 is a schematic cross-sectional view continued from FIG. 8, for explaining the example of the method of manufacturing the silicon carbide semiconductor device according to the first embodiment.

Next, an oxide film 22 (refer to FIG. 9) is deposited on the respective top surfaces of the source expansion region 71, the source contact region 72, and the base contact regions 5*a* and 5*b* by CVD or the like. A photoresist film is then applied to the top surface of the oxide film 22, and the oxide film 22 is delineated by photolithography and dry etching. Using the delineated oxide film 22 as a mask for etching, the trench 10 is selectively formed in the depth direction from the top surface of the source contact region 72 by dry etching such as reactive ion etching (RIE), as illustrated in FIG. 9. Instead of the oxide film 22, a photoresist film may be used as a mask for etching.

The trench 10 penetrates the source expansion region 71, the source contact region 72, and the base region 6 so as to further dig in a part of the gate protection region 4*b*. The provision of the trench 10 divides the source expansion region 71 into the two source expansion regions 71*a* and 71*b*, divides the source contact region 72 into the two source contact regions 72*a* and 72*b*, and divides the base region 6 into the two base regions 6*a* and 6*b*. The source expansion region 71*a* and the source contact region 72*a* implement the source region 7*a*, and the source expansion region 71*b* and the source contact region 72*b* implement the source region 7*b*. The oxide film 22 used as the mask for etching is then removed.

Next, the gate insulating film 11 (refer to FIG. 10) is formed along the bottom surface and the side surfaces of the trench 10 and the respective top surfaces of the source expansion regions 71*a* and 71*b*, the source contact regions 72*a* and 72*b*, and the base contact regions 5*a* and 5*b* by a method such as CVD, a high temperature oxidation (HTO) method, and a thermal oxidation method. Upon the formation of the gate insulating film 11, heat treatment (PDA: post deposition annealing) is executed at a temperature in a range of about 900° C. or higher and 1350° C. or lower, for example.

Figure 10:
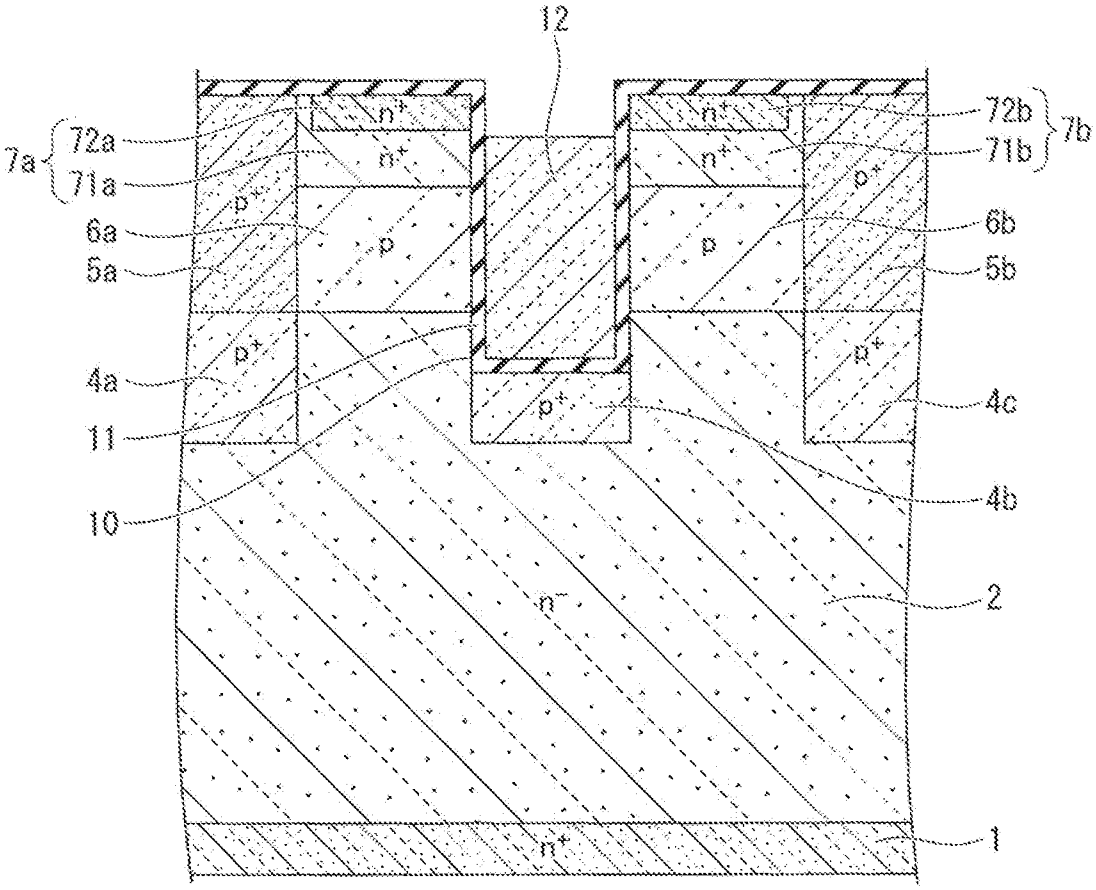
FIG. 10 is a schematic cross-sectional view continued from FIG. 9, for explaining the example of the method of manufacturing the silicon carbide semiconductor device according to the first embodiment.

Next, a polysilicon layer (a doped polysilicon layer) heavily doped with impurity ions such as phosphorus (P) or boron (B) is deposited to fill the inside of the trench 10 by CVD or the like. A part of the polysilicon layer 11 is then selectively removed by photolithography and dry etching. This step provides the insulated gate electrode structure (11, 12) implemented by the gate insulating film 11 and the gate electrode 12, as illustrated in FIG. 10. The drop amount of the gate electrode 12 may be adjusted at this point such that the top surface of the gate electrode 12 in contact with the gate insulating film 11 is located at a position deeper than the respective bottom surfaces of the source contact regions 72*a* and 72*b*.

Figure 11:
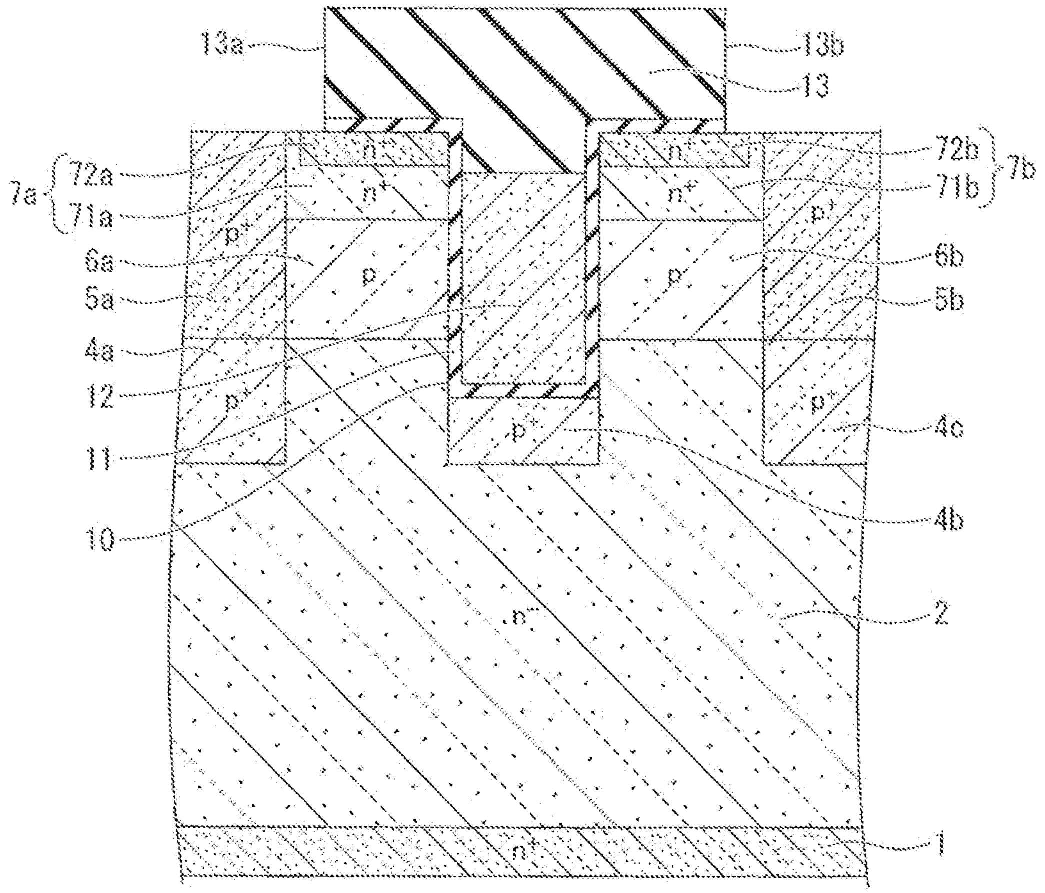
FIG. 11 is a schematic cross-sectional view continued from FIG. 10, for explaining the example of the method of manufacturing the silicon carbide semiconductor device according to the first embodiment.

Next, the interlayer insulating film 13 (refer to FIG. 11) is deposited on the top surface of the insulated gate electrode structure (11, 12) by CVD or the like. A part of the interlayer insulating film 13 and a part of the gate insulating film are then selectively removed by photolithography and dry etching so as to open the contact holes 13*a* and 13*b* in the interlayer insulating film 13 to which the respective top surfaces of the source expansion regions 71*a* and 71*b*, the source contact regions 72*a* and 72*b*, and the base contact regions 5*a* and 5*b* are at least partly exposed, as illustrated in FIG. 11. This step may be followed by heat treatment (reflowing) for flattening the interlayer insulating film 13.

Figure 12:
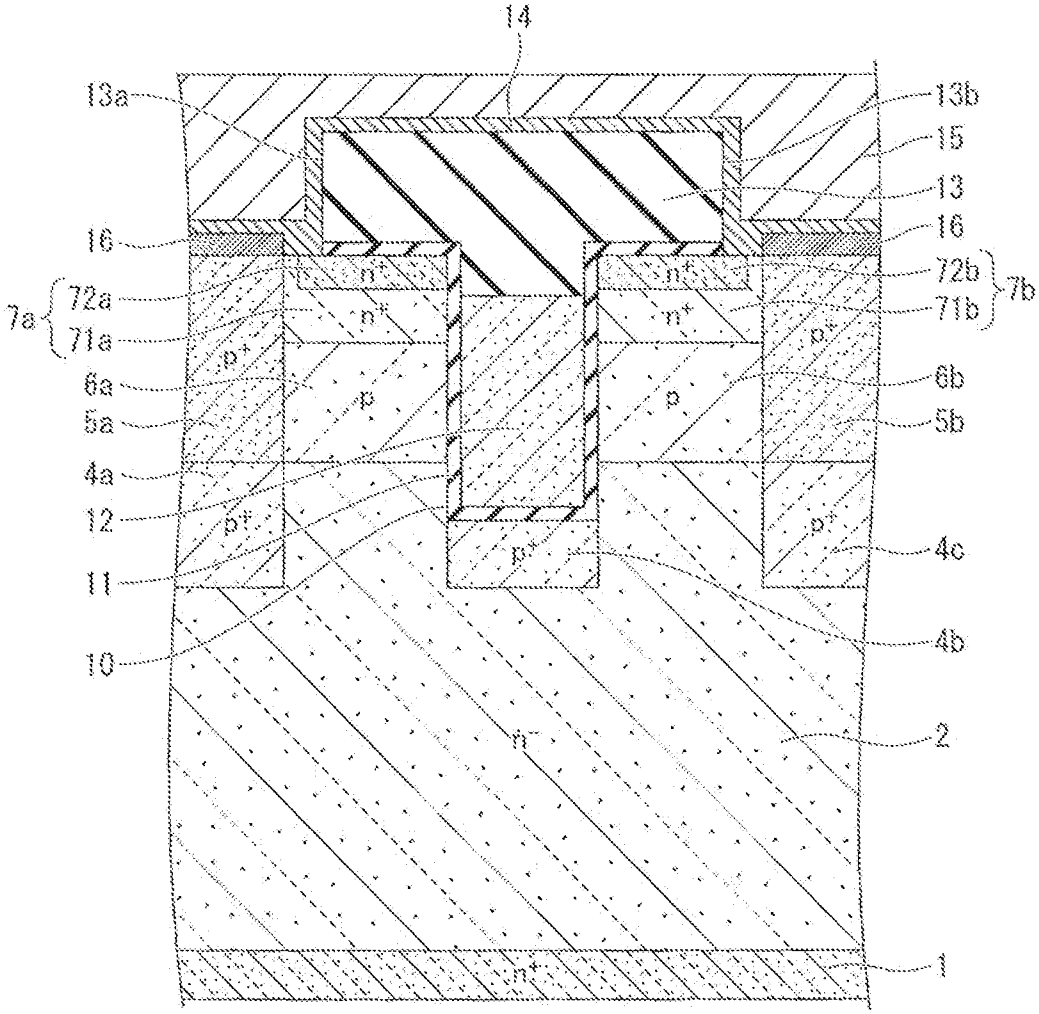
FIG. 12 is a schematic cross-sectional view continued from FIG. 11, for explaining the example of the method of manufacturing the silicon carbide semiconductor device according to the first embodiment.

Next, the silicide layer 16 (refer to FIG. 12) is deposited by sputtering or vapor deposition, for example, and a part of the silicide layer 16 is then selectively removed by photolithography and dry etching. This step selectively forms the silicide layer 16 on the respective top surfaces of the base contact regions 5*a* and 5*b*. The silicide layer 16 is in ohmic contact with the base contact regions 5*a* and 5*b* at a low resistance. Next, the barrier metal layer 14 and the source wiring layer 15 are sequentially formed to cover the interlayer insulating film 13 and further the source expansion regions 71*a* and 71*b*, the source contact regions 72*a* and 72*b*, and the silicide layer 16 exposed to the contact holes 13*a* and 13*b* of the interlayer insulating film 13 so as to form the source electrode (14, 15, 16) by sputtering or vapor deposition, for example, as illustrated in FIG. 12. The barrier metal layer 14 is to be in ohmic contact with the source contact regions 72*a* and 72*b* of the source regions 7*a* and 7*b*.

While the present embodiment is illustrated with the case in which the source contact regions 72*a* and 72*b* and the base contact regions 5*a* and 5*b* are each connected to the source electrode (14, 15, 16) through the contact holes 13*a* and 13*b*, the source contact regions 72*a* and 72*b* and the base contact regions 5*a* and 5*b* may be connected to the source electrode (14, 15, 16) through different contact holes independently of each other.

Next, the SiC substrate 1 is ground from the bottom surface side by grinding or chemical mechanical polishing (CMP) or the like to adjust the thickness as necessary, so as to lead to the drain region 1. Thereafter, the drain electrode 17 (refer to FIG. 1) including gold (Au) is formed on the entire bottom surface of the drain region 1 by sputtering or vapor deposition, for example. The silicon carbide semiconductor device illustrated in FIG. 1 is thus completed.

A method of manufacturing a semiconductor device of a comparative example is described below. The method of manufacturing the semiconductor device of the comparative example rationally uses a difference between the impurity concentration set for satisfying a contact resistance required for the source contact regions 72*a* and 72*b* and the impurity concentration set for satisfying a contact resistance required for the base contact regions 5*a* and 5*b* so as to form an n-type region for forming the source contact regions 72*a* and 72*b* on the entire surface, and then inverts (turns back) the conductivity of a part of the n-type region to the p-type so as to form the base contact regions 5*a* and 5*b*.

Figure 13:
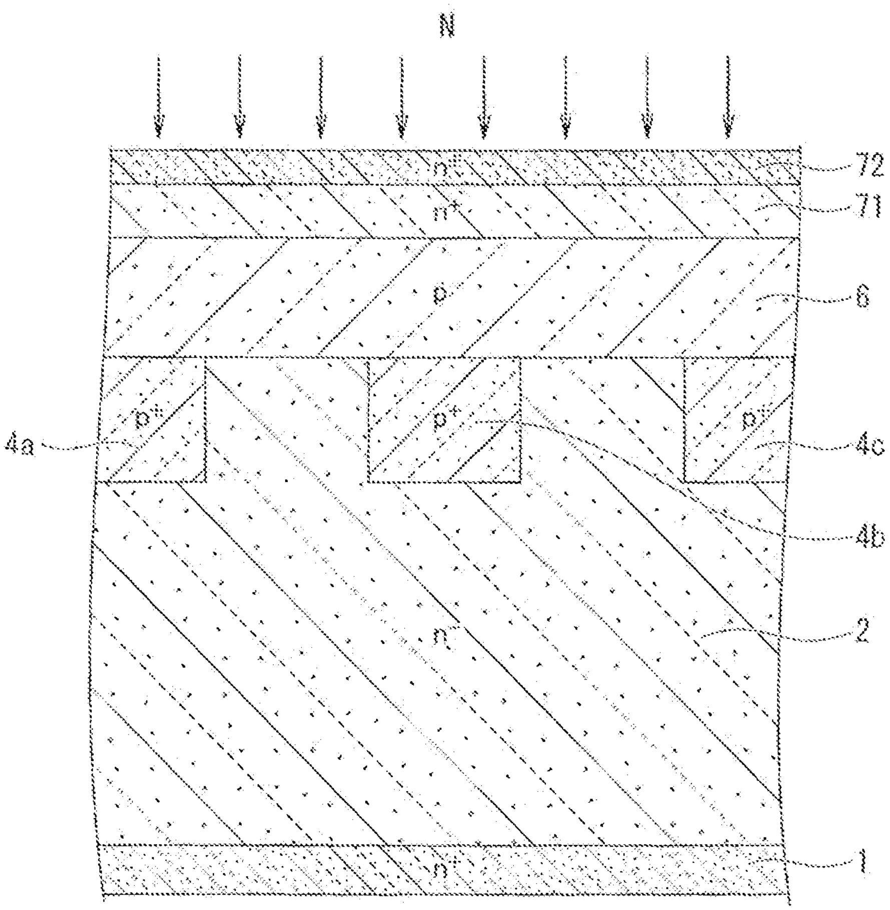
FIG. 13 is a schematic cross-sectional view for explaining a method of manufacturing a silicon carbide semiconductor device of a comparative example.

More particularly, the method of manufacturing the semiconductor device of the comparative example includes a process of forming the base region 6 and the source expansion region 71 illustrated in FIG. 6, and then implanting n-type impurity ions such as nitrogen (N) into the entire surface, as illustrated in FIG. 13. The $n^+$-type source contact region 72 is thus formed on the entire surface on the upper side of the source expansion region 71.

Next, an oxide film 21 is deposited on the top surface of the base region 6 (refer to FIG. 14), and is then delineated. Using the delineated oxide film 21 as a mask for ion implantation, p-type impurity ions such as aluminum (Al) are selectively implanted so as to invert (turn back) the conductivity of a part of the source expansion region 71 and the source contact region 72 to the p-type. This step selectively forms the $p^+$-type base contact regions 5*a* and 5*b* on the top surface side of the buried regions 4*a* and 4*c*.

Figure 14:
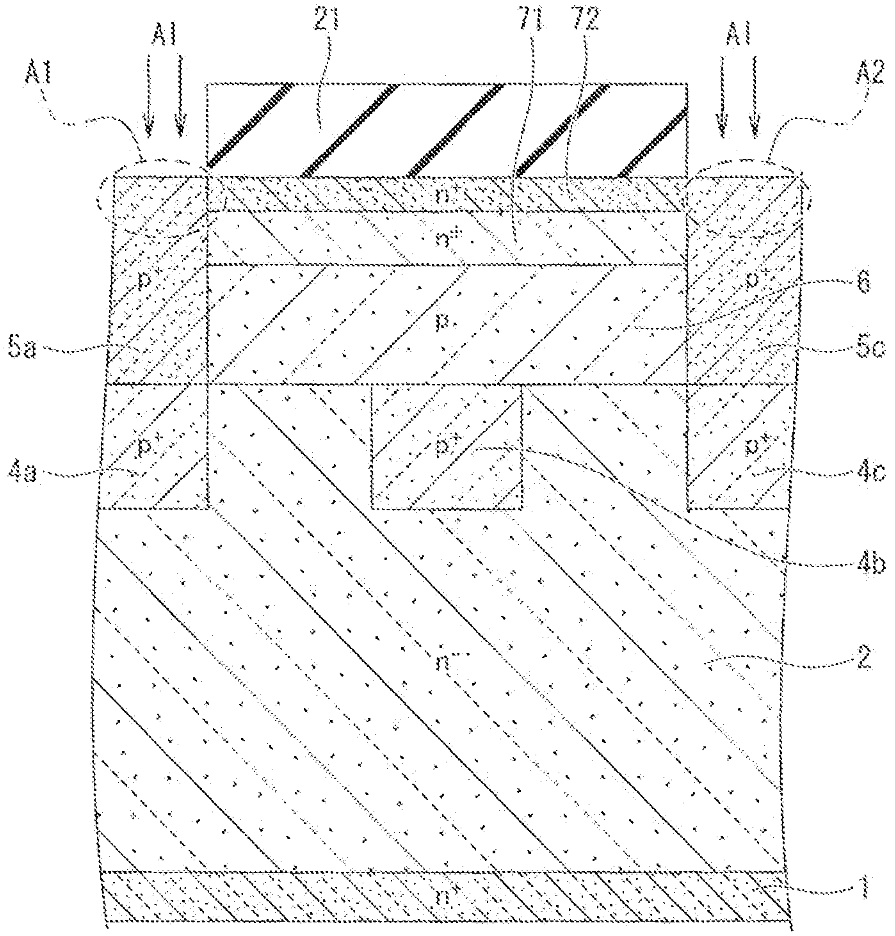
FIG. 14 is a schematic cross-sectional view continued from FIG. 13, for explaining the method of manufacturing the silicon carbide semiconductor device of the comparative example.

The method of manufacturing the semiconductor device of the comparative example, however, may cause a leakage defect at the turned-back part of the source contact region 72 corresponding to the respective regions A1 and A2 indicated by the broken lines in FIG. 14. The reason for this is presumed to be that the ion implantation for forming the source contact region 72 and the ion implantation for forming the base contact regions 5*a* and 5*b* cause a lot of damage to lead the base contact regions 5*a* and 5*b* to turn to 3C—SiC, leading to a source of leakage accordingly.

In contrast, the method of manufacturing the silicon carbide semiconductor device according to the first embodiment, when executing the ion implantation for forming the base contact regions 5*a* and 5*b*, can form the base contact regions 5*a* and 5*b* separately from the source contact region 72 by turning back a part of the source expansion region 71 without the turnback of the source contact region 72, as illustrated in FIG. 8. The crystal structure of the base contact regions 5*a* and 5*b* is thus not destroyed but turns to 4H—SiC, so as to avoid a leakage defect accordingly.

Second Embodiment

Figure 15:
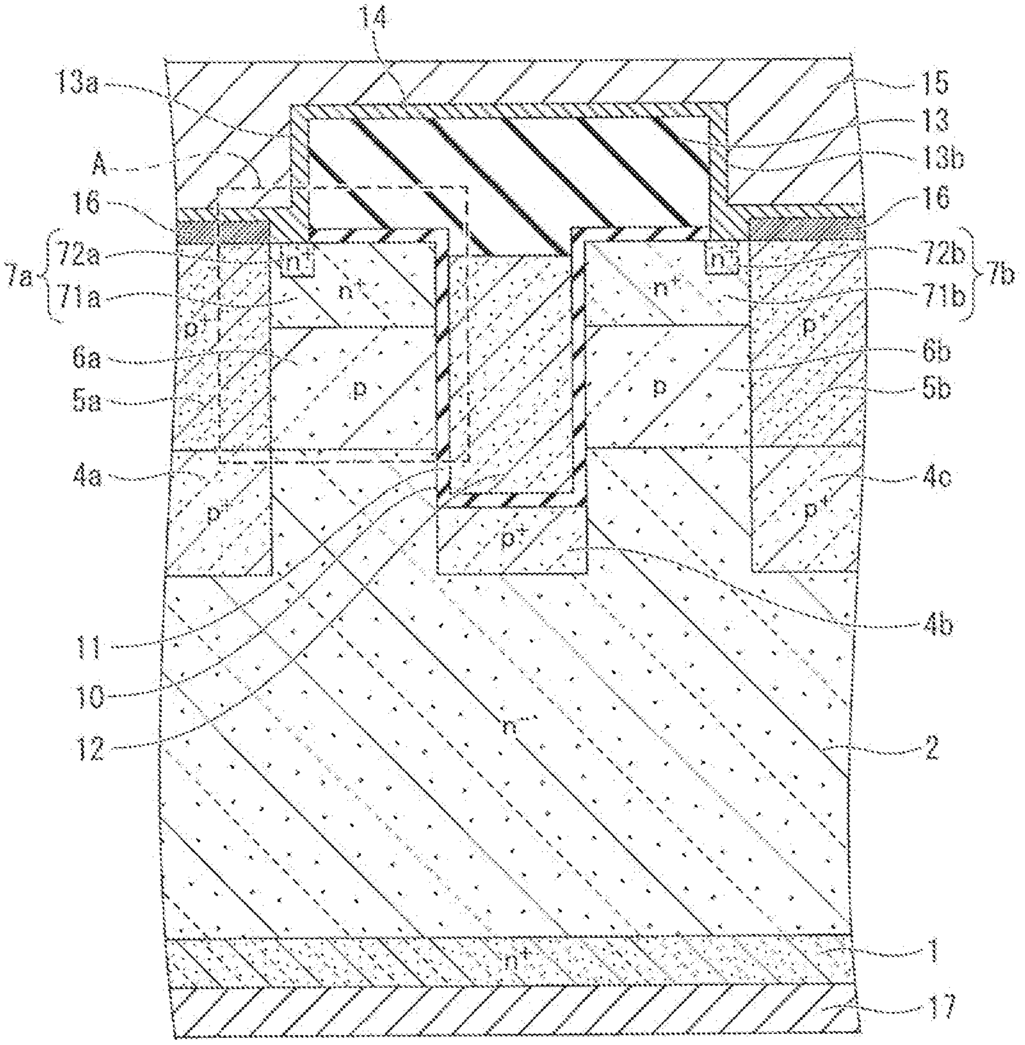
FIG. 15 is a schematic cross-sectional view illustrating an example of a silicon carbide semiconductor device according to a second embodiment.

A silicon carbide semiconductor device according to a second embodiment differs from the silicon carbide semiconductor device according to the first embodiment illustrated in FIG. 1 in that the $n^+$-type source contact regions 72*a* and 72*b* are provided separately from the gate insulating film 11 deposited inside the trench 10, as illustrated in FIG. 15.

Figure 16:
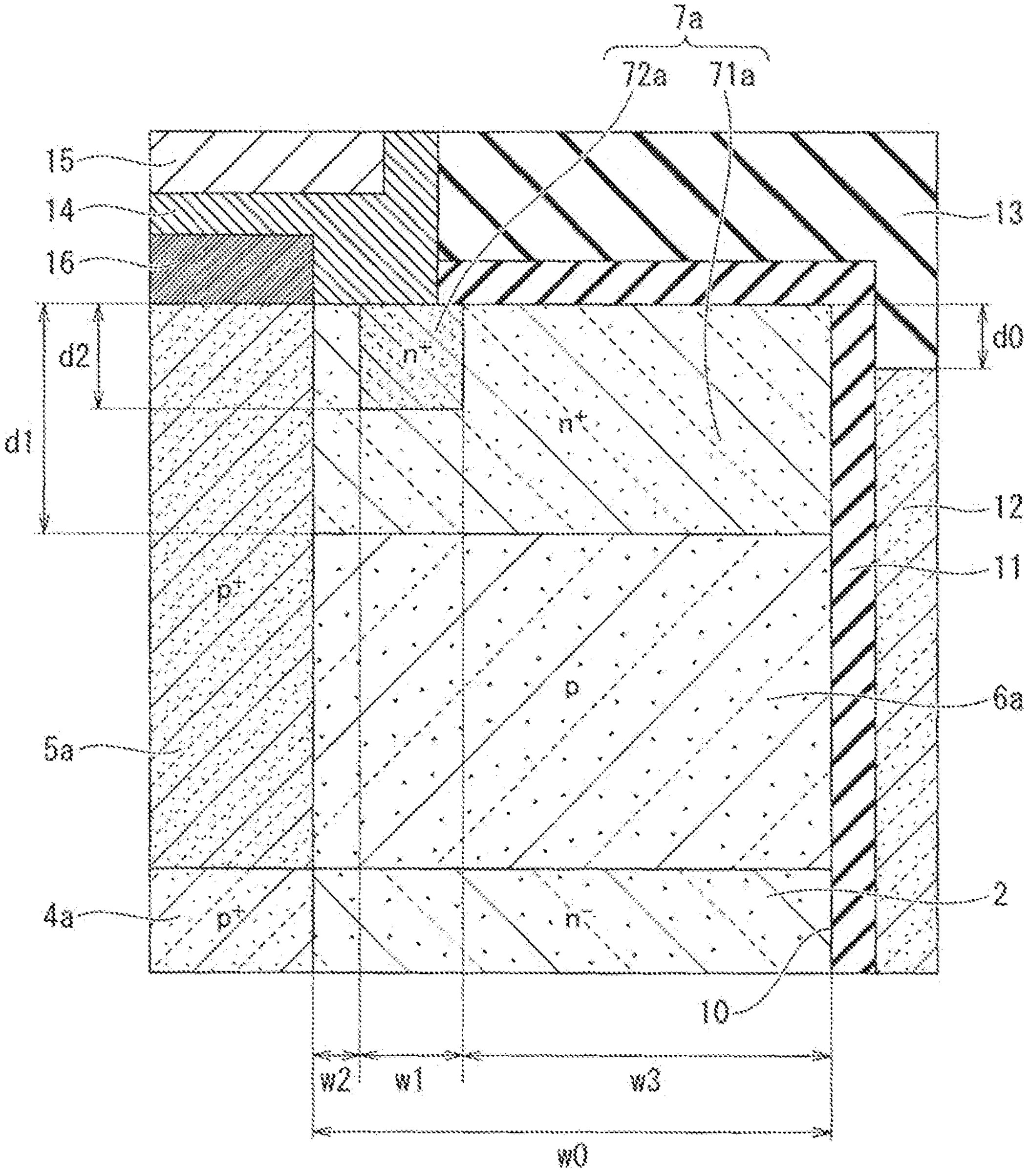
FIG. 16 is a schematic enlarged cross-sectional view of region A in FIG. 15.

FIG. 16 is a schematic enlarged cross-sectional view of region A indicated by the broken line illustrated in FIG. 15. The source contact region 72*a* is separated from the gate insulating film 11 deposited inside the trench 10. A width w3 in which the source contact region 72*a* is separated from the gate insulating film 11 inside the trench 10 (that is a width of the part of the source expansion region 71*a* interposed between the source contact region 72*a* and the gate insulating film 11) is in a range of about 100 nanometers or greater and 500 nanometers or smaller, for example. Setting the width w3 to 100 nanometers or greater can effectively avoid a gate leak current described below. The width w1 of the source contact region 72*a* is in a range of about 300 nanometers or greater and 500 nanometers or smaller, for example. The depth d2 from the top surface to the bottom surface of the source contact region 72*a* (the thickness of the source contact region 72*a*) is in a range of about 30 nanometers or greater and 100 nanometers or smaller, for example.

While FIG. 16 illustrates the case in which the end part (the side surface) of the source contact region 72*a* on the right side is shifted toward the gate electrode 12 from the end part of the contact hole 13*a* of the interlayer insulating film 13 (namely, from the respective end parts of the gate insulating film 11 and the interlayer insulating film 13), the end part of the source contact region 72*a* on the right side may conform to the end part of the contact hole 13*a* instead.

The end of the top surface (the upper end) of the gate electrode 12 in contact with the gate insulating film 11 is located at a position either conforming to or shallower than the bottom surface of the source contact region 72*a*. The drop amount do of the gate electrode 12 from the top surface of the source expansion region 71*a* is in a range of about 10 nanometers or greater and 300 nanometers or smaller, for example. Setting the drop amount do of the gate electrode 12 to be small and arranging the top surface of the gate electrode 12 to be shallower than the bottom surface of the source contact region 72*a* can reduce a variation of a gate threshold voltage. The end of the top surface of the gate electrode 12 in contact with the gate insulating film 11 may be located at a position deeper than the bottom surface of the source contact region 72*a* instead.

The source expansion region 71*b* and the source contact region 72*b* of the source region 7*b* illustrated in FIG. 15 have the configurations common to those of the source expansion region 71*a* and the source contact region 72*a* of the source region 7*a*, respectively, and overlapping explanations are not repeated below. The positional relation between the source expansion region 71*b* and the source contact region 72*b* of the source region 7*b* and each of the base contact region 5*b*, the gate insulating film 11, and the gate electrode 12 is also common to that between the source expansion region 71*a* and the source contact region 72*a* of the source region 7*a* and each of the base contact region 5*a*, the gate insulating film 11, and the gate electrode 12 illustrated in FIG. 16, and overlapping explanations are not repeated below. The other configurations of the silicon carbide semiconductor device according to the second embodiment are substantially the same as those of the silicon carbide semiconductor device according to the first embodiment, and overlapping explanations are not repeated below.

A method of manufacturing the silicon carbide semiconductor device according to the second embodiment differs from the method of manufacturing the silicon carbide semiconductor device according to the first embodiment illustrated in FIG. 7 in that the oxide film 20 (refer to FIG. 17) is delineated so as to further cover the region in which the trench 10 is to be formed by photolithography and dry etching, for example, after the step of forming the base region 6 and the source expansion region 71 illustrated in FIG. 6.

Figure 17:
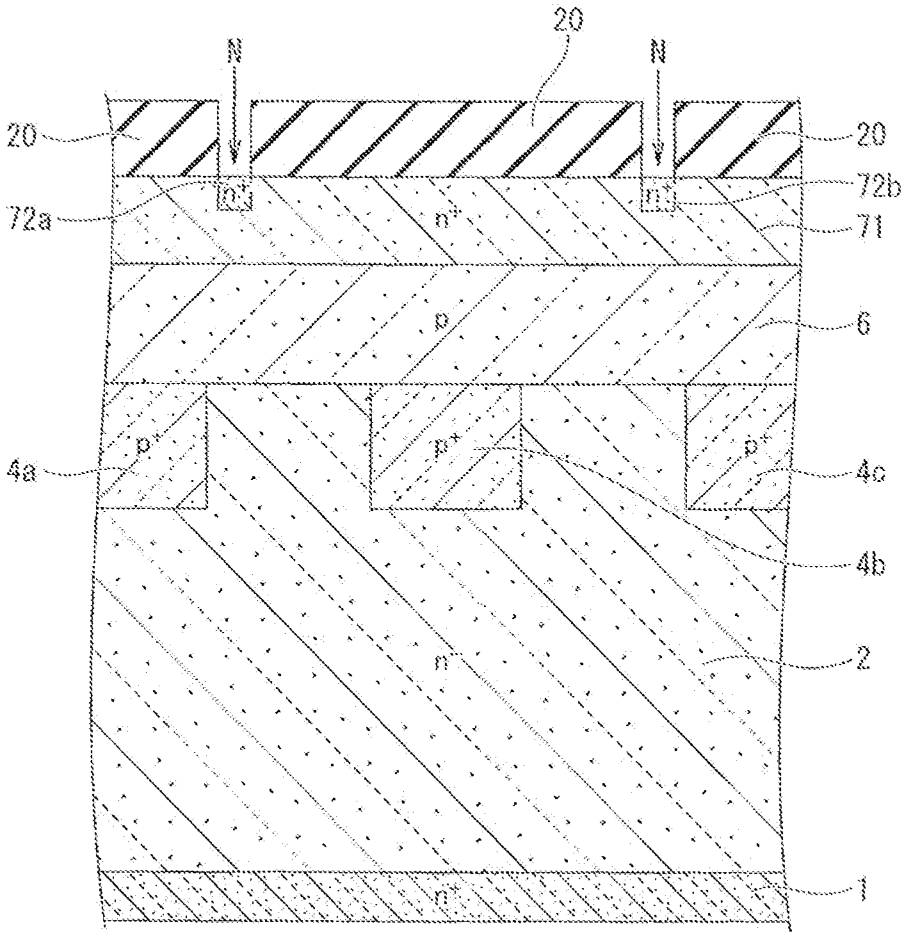
FIG. 17 is a schematic cross-sectional view for explaining an example of a method of manufacturing the silicon carbide semiconductor device according to the second embodiment.

As illustrated in FIG. 17, using the delineated oxide film 20 as a mask for ion implantation, n-type impurity ions such as nitrogen (N) are selectively implanted. Instead of the oxide film 20, a photoresist film may be used as a mask for ion implantation. This step forms the $n^+$-type source contact regions 72*a* and 72*b* on the top surface side of the source expansion region 71. The other steps of the method of manufacturing the silicon carbide semiconductor device according to the second embodiment are substantially the same as those of the method of manufacturing the silicon carbide semiconductor device according to the first embodiment, and overlapping explanations are not repeated below.

The configuration according to the second embodiment leads the source contact regions 72*a* and 72*b* of the source regions 7*a* and 7*b* including 3C—SiC to be in contact with the source electrode (14, 15, 16), so as to achieve the ohmic contact at a low resistance without the silicide layer 16 interposed. This configuration can eliminate a problem of separation of the silicide layer 16 since the silicide layer 16 does not need to be provided on the contact joint surface of the respective source contact regions 72*a* and 72*b*.

Further, the configuration according to the second embodiment leads the source expansion regions 71*a* and 71*b* including 4H—SiC to be interposed between the source contact regions 72*a* and 72*b* including 3C—SiC and the base contact regions 5*a* and 5*b* including 4H—SiC. This configuration can exclude damage derived from the ion implantation for the source expansion regions 71*a* and 71*b* to be formed in the base contact regions 5*a* and 5*b*, so as to avoid a leakage defect accordingly, as compared with a case in which the source contact regions 72*a* and 72*b* and the base contact regions 5*a* and 5*b* are in contact with each other.

Further, the configuration according to the second embodiment, in which the respective source expansion regions 71*a* and 71*b* and the respective base contact regions 5*a* and 5*b* implementing the p-n junction both include 4H—SiC, can avoid a leak current at the p-n junction part, as compared with a case in which the p-n junction is implemented by the source contact regions 72*a* and 72*b* including 3C—SiC and the base contact regions 5*a* and 5*b* including 4H—SiC.

Further, the configuration according to the second embodiment leads the source contact regions 72*a* and 72*b* of the source regions 7*a* and 7*b* including 3C—SiC with a relatively large amount of crystal defects to be separated from the gate insulating film 11 and the gate electrode 12 inside the trench 10 so as not to be directly in contact with the gate insulating film 11. Instead, the source expansion regions 71*a* and 71*b* of the source regions 7*a* and 7*b* including 4H—SiC with a relatively small amount of crystal defects are directly in contact with the gate insulating film 11 inside the trench 10 so as to be opposed to the gate electrode 12 with the gate insulating film 11 interposed. This configuration can suppress a cause of a leak current between the respective source regions 7*a* and 7*b* and the gate electrode 12.

Third Embodiment

Figure 18:
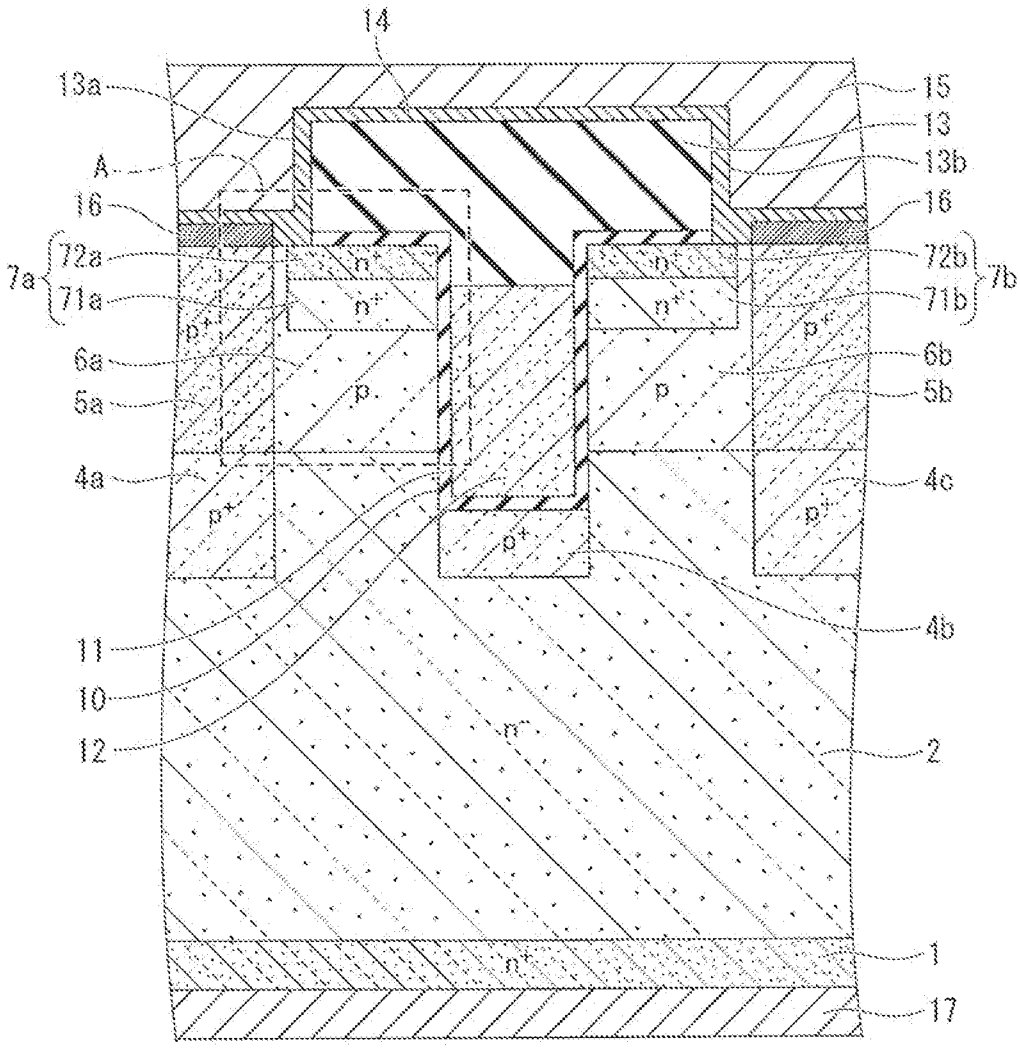
FIG. 18 is a schematic cross-sectional view illustrating an example of a silicon carbide semiconductor device according to a third embodiment.

A silicon carbide semiconductor device according to a third embodiment differs from the silicon carbide semiconductor device according to the first embodiment illustrated in FIG. 1 in that the semiconductor regions including 4H—SiC interposed between the $n^+$-type source contact regions 72$a$ and 72$b$ and the base contact regions 5$a$ and 5$b$ are each implemented by a part of the base regions 6$a$ and 6$b$, as illustrated in FIG. 18. The respective base regions 6$a$ and 6$b$ have an L-shape in cross section.

Figure 19:
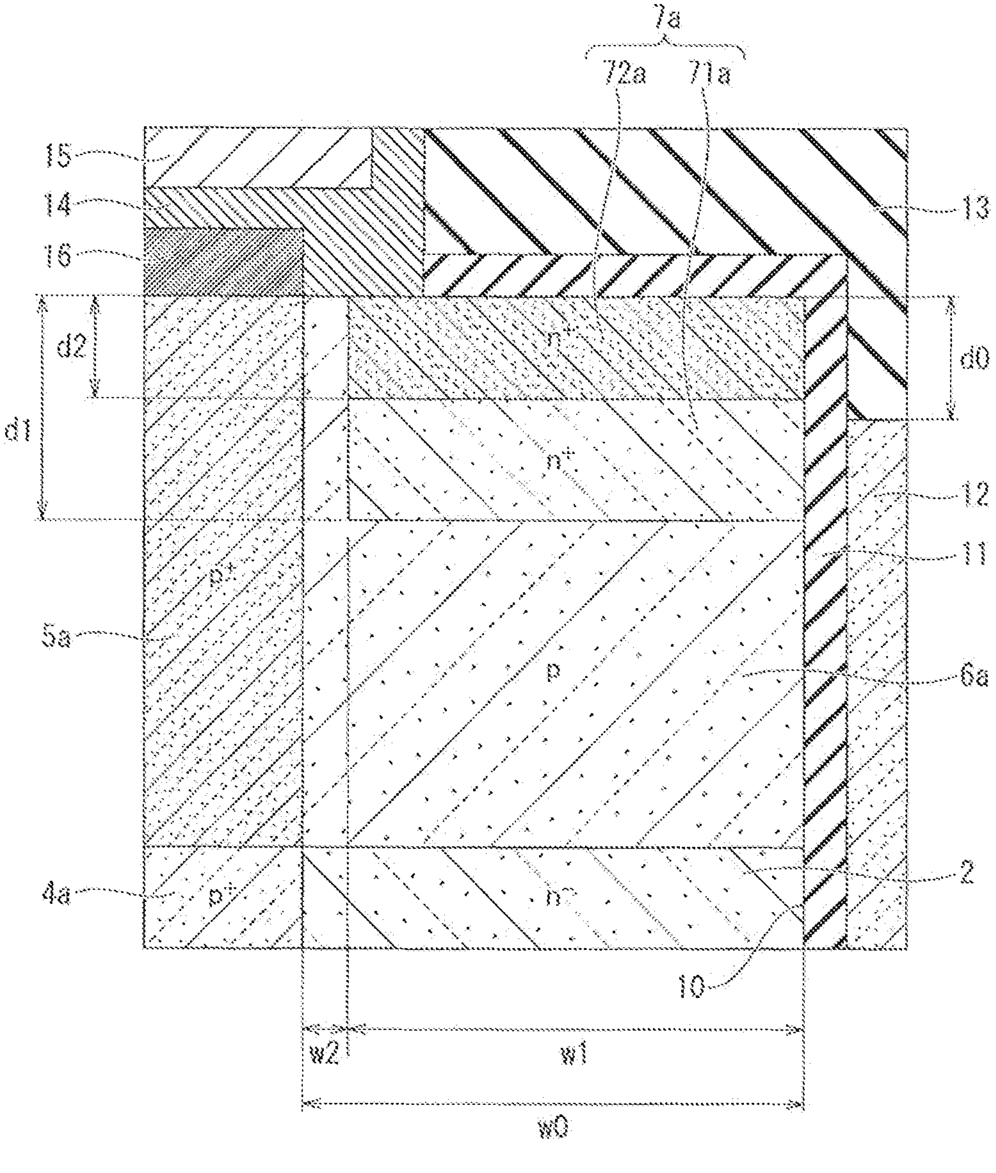
FIG. 19 is a schematic enlarged cross-sectional view of region A in FIG. 18.

FIG. 19 is a schematic enlarged cross-sectional view of region A illustrated in FIG. 18. The position of the side surface of the source expansion region 71$a$ on the left side substantially conforms to the position of the side surface of the source contact region 72$a$ on the left side. The respective side surfaces of the source expansion region 71$a$ and the source contact region 72$a$ on the left side are separated from the side surface of the base contact region 5$a$ on the right side. A part of the base region 6$a$ is interposed between the respective side surfaces of the source expansion region 71$a$ and the source contact region 72$a$ on the left side and the side surface of the base contact region 5$a$ on the right side.

The source expansion region 71$b$ and the source contact region 72$b$ of the source region 7$b$ illustrated in FIG. 18 have the configurations common to those of the source expansion region 71$a$ and the source contact region 72$a$ of the source region 7$a$, respectively, and overlapping explanations are not repeated below. The positional relation between the source expansion region 71$b$ and the source contact region 72$b$ of the source region 7$b$ and each of the base contact region 5$b$, the gate insulating film 11, and the gate electrode 12 is also common to that between the source expansion region 71$a$ and the source contact region 72$a$ of the source region 7$a$ and each of the base contact region 5$a$, the gate insulating film 11, and the gate electrode 12 illustrated in FIG. 19, and overlapping explanations are not repeated below. The other configurations of the silicon carbide semiconductor device according to the third embodiment are substantially the same as those of the silicon carbide semiconductor device according to the first embodiment, and overlapping explanations are not repeated below.

A method of manufacturing the silicon carbide semiconductor device according to the third embodiment does not include the step of the ion implantation for forming the source expansion region 71 on the entire surface illustrated in FIG. 6. Instead, the ion implantation is executed by use of the common oxide film 20 as a mask for ion implantation during the ion implantation for forming the $n^+$-type source contact region 72 as illustrated in FIG. 7, so as to form the $n^+$-type source expansion region 71 having the same width as the source contact region 72. The other steps of the method of manufacturing the silicon carbide semiconductor device according to the third embodiment are substantially the same as those of the method of manufacturing the silicon carbide semiconductor device according to the first embodiment, and overlapping explanations are not repeated below.

The configuration according to the third embodiment leads the source contact regions 72$a$ and 72$b$ of the source regions 7$a$ and 7$b$ including 3C—SiC to be in contact with the source electrode (14, 15, 16), so as to achieve the ohmic contact at a low resistance without the silicide layer 16 interposed. This configuration can eliminate a problem of separation of the silicide layer 16 since the silicide layer 16 does not need to be provided on the contact joint surface of the respective source contact regions 72$a$ and 72$b$.

Further, the configuration according to the third embodiment leads the base regions 6$a$ and 6$b$ including 4H—SiC to be interposed between the source contact regions 72$a$ and 72$b$ including 3C—SiC and the base contact regions 5$a$ and 5$b$ including 4H—SiC. This configuration can exclude damage derived from the ion implantation for the source expansion regions 71$a$ and 71$b$ to be formed in the base contact regions 5$a$ and 5$b$, so as to avoid a leakage defect accordingly, as compared with a case in which the source contact regions 72$a$ and 72$b$ and the base contact regions 5$a$ and 5$b$ are in contact with each other.

Fourth Embodiment

Figure 20:
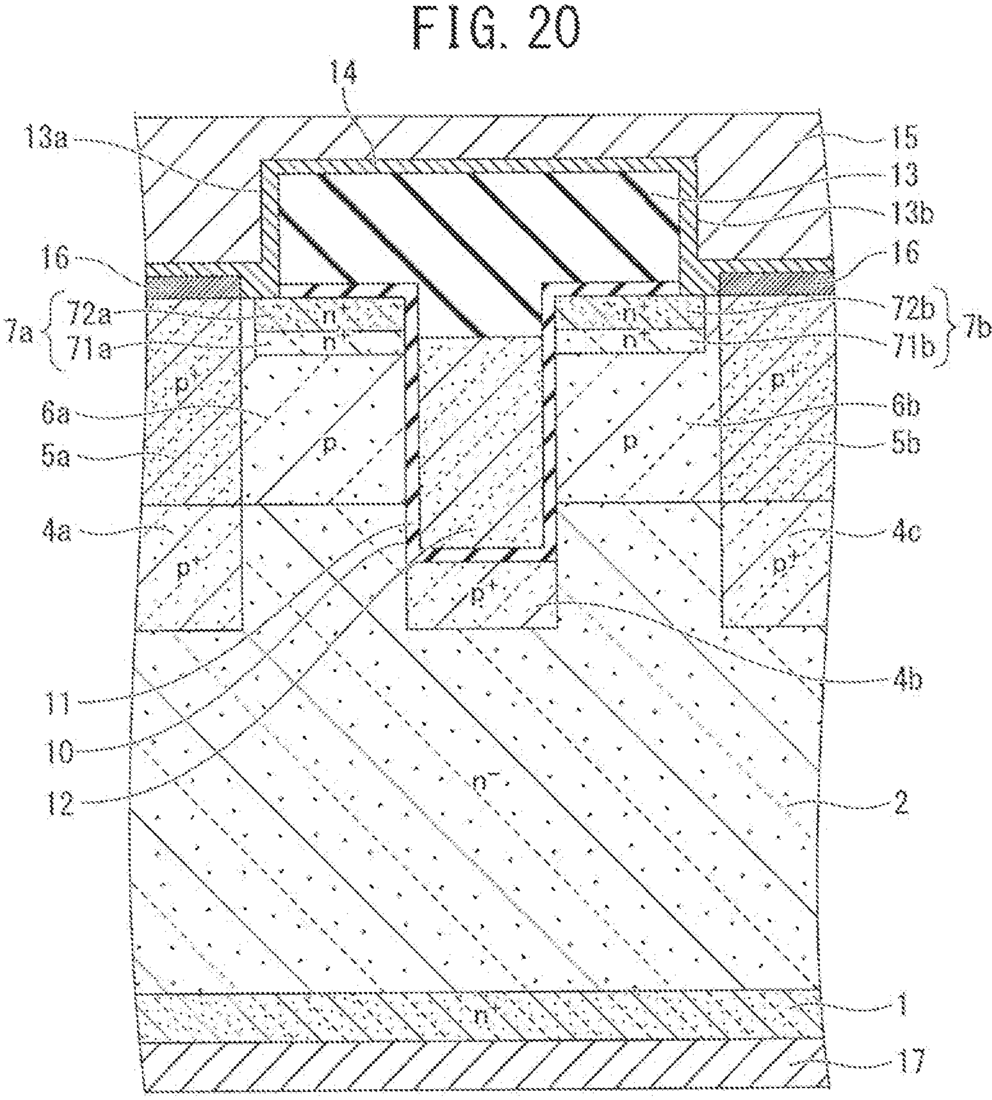
FIG. 20 is a schematic cross-sectional view illustrating an example of a silicon carbide semiconductor device according to a fourth embodiment.

A silicon carbide semiconductor device according to a fourth embodiment differs from the silicon carbide semiconductor device according to the first embodiment illustrated in FIG. 1 in that the $n^+$-type source expansion regions 71$a$ and 71$b$ have a smaller thickness, as illustrated in FIG. 20.

The other configurations of the silicon carbide semiconductor device according to the fourth embodiment are substantially the same as those of the silicon carbide semiconductor device according to the first embodiment, and overlapping explanations are not repeated below.

A method of manufacturing the silicon carbide semiconductor device according to the fourth embodiment does not include the step of the ion implantation for forming the source expansion region 71 illustrated in FIG. 6. Instead, the method includes the step of selectively implanting the n-type impurity ions such as nitrogen (N) by use of the delineated oxide film 20 as a mask for ion implantation illustrated in FIG. 7, so as to selectively form the $n^+$-type source contact region 72 in a part on the top surface side (at the upper part) of the respective base regions 6$a$ and 6$b$.

During the ion implantation for the source contact region 72, the structure of 4H—SiC on the top surface side of the base region 6 is destroyed so as to form an amorphous structure. The ion implantation at this point inevitably causes a concentration gradient on the deeper side, providing a region having a low impurity concentration on the deeper side accordingly. The region with the low impurity concentration turns to the 4H—SiC structure after the annealing, and 4H—SiC is thus used for the $n^+$-type source expansion regions 71$a$ and 71$b$. The other steps of the method of manufacturing the silicon carbide semiconductor device according to the fourth embodiment are substantially the same as those of the method of manufacturing the silicon carbide semiconductor device according to the first embodiment, and overlapping explanations are not repeated below.

The configuration according to the fourth embodiment, in which the source expansion regions 71$a$ and 71$b$ have a smaller thickness, can also achieve the ohmic contact at a low resistance without the silicide layer 16 interposed. This configuration can eliminate a problem of separation of the silicide layer 16 since the silicide layer 16 does not need to be provided on the contact joint surface of the respective source contact regions 72$a$ and 72$b$.

Further, the configuration according to the fourth embodiment leads the base regions 6$a$ and 6$b$ including 4H—SiC to be interposed between the source contact regions 72$a$ and 72$b$ including 3C—SiC and the base contact regions 5$a$ and 5$b$ including 4H—SiC. This configuration can exclude damage derived from the ion implantation for the source expansion regions 71$a$ and 71$b$ to be formed in the base contact regions 5$a$ and 5$b$, so as to avoid a leakage defect accordingly, as compared with a case in which the source contact regions 72$a$ and 72$b$ and the base contact regions 5$a$ and 5$b$ are in contact with each other.

Other Embodiments

As described above, the invention has been described according to the first to fourth embodiments, but it should not be understood that the description and drawings implementing a portion of this disclosure limit the invention. Various alternative embodiments of the present invention, examples, and operational techniques will be apparent to those skilled in the art from this disclosure.

For example, while the first to fourth embodiments have been illustrated above with the case of using the MOSFET as the semiconductor device, the present invention can also be applied to an insulated gate bipolar transistor (IGBT) having a structure provided with a $p^+$-type collector region instead of the $n^+$-type drain region 1. The present invention can further be applied to a reverse-conducting insulated gate bipolar transistor (RC-IGBT) or a reverse-blocking insulated gate bipolar transistor (RB-IGBT), instead of the simple IGBT.

In addition, the respective configurations disclosed in the first to fourth embodiments can be combined together as appropriate without contradiction with each other. For example, while the third and fourth embodiments have been illustrated with the case in which the $n^+$-type source contact regions 72*a* and 72*b* are in contact with the gate insulating film 11 buried inside the trench 10, the $n^+$-type source contact regions 72*a* and 72*b* may be separated from the gate insulating film 11 inside the trench 10, as in the case of the semiconductor device according to the second embodiment.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

What is claimed is:

1. A silicon carbide semiconductor device comprising:

a drift layer of a first conductivity-type including silicon carbide;

a base region of a second conductivity-type including silicon carbide provided on a top surface side of the drift layer;

a source contact region of the first conductivity-type including silicon carbide having a 3C-structure provided on a top surface side of the base region;

a gate insulating film provided inside a trench penetrating the source contact region and the base region;

a gate electrode buried inside the trench with the gate insulating film interposed;

a base contact region of the second conductivity-type including silicon carbide having a 4H-structure provided on the top surface side of the drift layer and having a higher impurity concentration than the base region;

a semiconductor region including silicon carbide having a 4H-structure provided between the source contact region and the base contact region; and a main electrode provided to be in contact with the source contact region.

2. The silicon carbide semiconductor device of claim 1, wherein the source contact region is in contact with the trench.

3. The silicon carbide semiconductor device of claim 1, wherein the source contact region is separated from the trench.

4. The silicon carbide semiconductor device of claim 1, further comprising a source expansion region of the first conductivity-type including silicon carbide having a 4H-structure and provided to be in contact with a bottom surface of the source contact region.

5. The silicon carbide semiconductor device of claim 4, wherein the semiconductor region is a part of the source expansion region.

6. The silicon carbide semiconductor device of claim 1, wherein the semiconductor region is a part of the base region.

7. The silicon carbide semiconductor device of claim 6, further comprising a source expansion region of the first conductivity-type including silicon carbide having a 4H-structure and provided to be in contact with a bottom surface of the source contact region, wherein a part of the base region is provided between the source expansion region and the base contact region.

8. The silicon carbide semiconductor device of claim 1, wherein a top surface of the gate electrode is located at a position deeper than a bottom surface of the source contact region.

9. The silicon carbide semiconductor device of claim 3, wherein a top surface of the gate electrode is located at a position either conforming to or shallower than a bottom surface of the source contact region.

10. The silicon carbide semiconductor device of claim 4, wherein the source expansion region has a lower impurity concentration than the source contact region.

11. The silicon carbide semiconductor device of claim 4, wherein the source expansion region has an impurity concentration common to that of the source contact region.

12. The silicon carbide semiconductor device of claim 1, wherein a bottom surface of the base contact region is located at a position either conforming to or shallower than a bottom surface of the base region.

13. The silicon carbide semiconductor device of claim 1, wherein a proportion of the 3C-structure included in the source contact region is in a range of 10% or higher and 100% or lower.

14. The silicon carbide semiconductor device of claim 1, wherein the source contact region includes phosphorus or arsenic as impurity ions.

15. The silicon carbide semiconductor device of claim 1, wherein the source contact region has an impurity concentration in a range of $1\times10^{20}/cm^3$ or higher and $1\times10^{22}/cm^3$ or lower.

16. The silicon carbide semiconductor device of claim 4, wherein the source expansion region has an impurity concentration in a range of $1\times10^{16}/cm^3$ or higher and $1\times10^{20}/cm^3$ or lower.

17. The silicon carbide semiconductor device of claim 4, wherein the source expansion region includes nitrogen or phosphorus as impurity ions.

18. The silicon carbide semiconductor device of claim 1, wherein the base contact region has an impurity concentration in a range of $1\times10^{19}/cm^3$ or higher and $1\times10^{21}/cm^3$ or lower.

19. The silicon carbide semiconductor device of claim 1, wherein the base contact region includes aluminum as impurities.

20. The silicon carbide semiconductor device of claim 1, wherein the main electrode includes a silicide layer in contact with the base contact region.

* * * * *